(12) United States Patent
Jung et al.

(10) Patent No.: US 12,433,065 B2
(45) Date of Patent: Sep. 30, 2025

(54) LIGHT-EMITTING ELEMENT, DISPLAY APPARATUS, AND MANUFACTURING METHOD THEREFOR

(71) Applicant: Samsung Display Co., LTD., Yongin-si (KR)

(72) Inventors: Jae Hoon Jung, Seoul (KR); Hye Jung Hong, Cheonan-si (KR); Jong Hyuk Kang, Suwon-si (KR); Hee Yeon Yoo, Hwaseong-si (KR); Sung Chan Jo, Seoul (KR); Hyun Min Cho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 567 days.

(21) Appl. No.: 17/778,667

(22) PCT Filed: Sep. 3, 2020

(86) PCT No.: PCT/KR2020/011850
§ 371 (c)(1),
(2) Date: May 20, 2022

(87) PCT Pub. No.: WO2021/101033
PCT Pub. Date: May 27, 2021

(65) Prior Publication Data
US 2023/0026527 A1 Jan. 26, 2023

(30) Foreign Application Priority Data
Nov. 22, 2019 (KR) .......................... 10-2019-0151117

(51) Int. Cl.
*H10H 20/01* (2025.01)
*H01L 25/075* (2006.01)
(Continued)

(52) U.S. Cl.
CPC .......... *H10H 20/01* (2025.01); *H01L 25/0753* (2013.01); *H10H 20/8312* (2025.01);
(Continued)

(58) Field of Classification Search
CPC .... H10H 20/01; H10H 20/8312; H10H 20/85; H10H 20/857; H10H 20/032;
(Continued)

(56) References Cited

U.S. PATENT DOCUMENTS 9,133,388 B2 * 9/2015 Modi ...................... H10H 20/01
9,842,962 B2 12/2017 Woo et al.
(Continued)

FOREIGN PATENT DOCUMENTS

JP 2004-269738 9/2004
JP 2006-182710 7/2006
(Continued)

OTHER PUBLICATIONS

Psarski, M., Celichowski, G., Bystrzycka, E., Pawlak, D., Grobelny, J., & Cichomski, M. Vapor phase deposition of fluoroalkyl trichlorosilanes on silicon and glass: Influence of deposition conditions and chain length on wettability and adhesion forces. Materials Chemistry and Physics, 204, 305—(Year: 2018).*
(Continued)

*Primary Examiner* — Michelle Mandala
(74) *Attorney, Agent, or Firm* — Womble Bond Dickinson (US) LLP

(57) ABSTRACT

A light-emitting element includes a first semiconductor layer doped to have a first polarity; a second semiconductor layer doped to have a second polarity that is different from the first polarity; an active layer placed between the first semiconductor layer and the second semiconductor layer; and an insulating layer surrounding at least the outer surface of the active material. The insulating layer includes an insulating
(Continued)

film surrounding the active layer, and an element dispersion agent including a magnetic metal and bonded to an outer surface of the insulating film.

6 Claims, 17 Drawing Sheets

(51) Int. Cl.
H10H 20/831 (2025.01)
H10H 20/85 (2025.01)
H10H 20/857 (2025.01)
H10K 85/30 (2023.01)
H10H 20/813 (2025.01)
H10H 20/818 (2025.01)
H10H 20/84 (2025.01)

(52) U.S. Cl.
CPC .......... H10H 20/85 (2025.01); H10H 20/857 (2025.01); H10K 85/30 (2023.02); H10K 85/331 (2023.02); *H01L 2924/00* (2013.01); *H10H 20/032* (2025.01); *H10H 20/813* (2025.01); *H10H 20/818* (2025.01); *H10H 20/84* (2025.01)

(58) Field of Classification Search
CPC .... H10H 20/813; H10H 20/818; H10H 20/84; H01L 25/0753; H01L 2924/00; H10K 85/30; H10K 85/331
See application file for complete search history.

(56) References Cited

U.S. PATENT DOCUMENTS

| | | | | |
|---|---|---|---|---|
| 9,847,494 B2* | 12/2017 | Van Der Boom | ....... | G11C 7/00 |
| 9,978,725 B2 | 5/2018 | Do | | |
| 11,367,823 B2 | 6/2022 | Kim et al. | | |
| 11,811,012 B2 | 11/2023 | Kim et al. | | |
| 2015/0287878 A1* | 10/2015 | Ono | .................... | H10K 50/115 |
| | | | | 438/46 |
| 2015/0333229 A1* | 11/2015 | Seo | ........................ | H10H 20/84 |
| | | | | 257/89 |
| 2016/0115383 A1 | 4/2016 | Kuzumoto et al. | | |
| 2017/0005296 A1* | 1/2017 | Soci | ........................ | H10K 50/16 |
| 2017/0271603 A1 | 9/2017 | Hattori et al. | | |
| 2017/0356089 A1 | 12/2017 | Kanehara et al. | | |
| 2018/0138157 A1 | 5/2018 | Im et al. | | |
| 2018/0151814 A1* | 5/2018 | Hirose | ................... | H10K 85/30 |
| 2018/0182741 A1 | 6/2018 | Sung et al. | | |
| 2018/0348577 A1* | 12/2018 | Pousthomis | ......... | G03B 21/204 |
| 2021/0139770 A1* | 5/2021 | Pousthomis | ....... | C09K 11/0883 |
| 2022/0320057 A1 | 10/2022 | Hwang et al. | | |
| 2024/0063359 A1 | 2/2024 | Kim et al. | | |

FOREIGN PATENT DOCUMENTS

| | | | | |
|---|---|---|---|---|
| JP | 4752269 | | 8/2011 | |
| JP | 4752269 B2 * | | 8/2011 | |
| KR | 10-2011-0028231 | | 3/2011 | |
| KR | 10-1429095 | | 8/2014 | |
| KR | 10-1770632 | | 8/2017 | |
| KR | 10-1781976 B1 | | 10/2017 | |
| KR | 10-2018-0055021 | | 5/2018 | |
| KR | 20180055021 A * | | 5/2018 | ......... H01L 25/0753 |
| KR | 10-2019-0017691 | | 2/2019 | |
| KR | 10-2019-0087221 A | | 7/2019 | |
| KR | 10-2019-0105537 | | 9/2019 | |
| KR | 10-2019-0112226 | | 10/2019 | |
| KR | 10-2019-0122117 | | 10/2019 | |
| KR | 10-2019-0124359 | | 11/2019 | |

OTHER PUBLICATIONS

Written Opinion, with English translation, corresponding to International Application No. PCT/KR2020/011850, dated Dec. 9, 2020.
Daiki Shimizu et al., "Aminyl Radical Bridged Nill-Porphyrin Dimer: Coordination-Induced Spin-State Switching between Doublet and Sextet States", Angewandte Chemie, 2019, http://dx.doi.org/10.1002/ange.201900792.
International Search Report, with English translation, corresponding to International Application No. PCT/KR2020/011850 dated Dec. 9, 2020.
Korean Notice of Allowance issued in corresponding KR Application No. 10-2019-0151117, dated Jun. 10, 2025, 3 pages.

* cited by examiner

LIGHT-EMITTING ELEMENT, DISPLAY APPARATUS, AND MANUFACTURING METHOD THEREFOR

CROSS-REFERENCE TO RELATED APPLICATION(S)

This application is a national entry of International Application No. PCT/KR2020/011850, filed on Sep. 3, 2020, which claims under 35 U.S.C. §§ 119(a) and 365(b) priority to and benefits of Korean Patent Application No. 10-2019-0151117, filed on Nov. 22, 2019, in the Korean Intellectual Property Office (KIPO), the entire contents of which are incorporated herein by reference.

BACKGROUND

1. Technical Field

The invention relates to a light-emitting element, a display device, and a manufacturing method therefor.

2. Description of Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

SUMMARY

Aspects of the disclosure provide a light-emitting element having an element dispersion agent, which includes a magnetic metal, bonded to an outer surface thereof.

Aspects of the disclosure also provide a display device including the light-emitting element and a manufacturing method therefor.

It should be noted that aspects of the disclosure are not limited thereto and other aspects, which are not mentioned herein, will be apparent to those of ordinary skill in the art from the following description.

According to an embodiment of the disclosure, a light-emitting element, comprises a first semiconductor layer doped with a first polarity, a second semiconductor layer doped with a second polarity different from the first polarity, an active layer disposed between the first semiconductor layer and the second semiconductor layer, and an insulating layer surrounding at least an outer surface of the active layer, wherein the insulating layer includes an insulating film surrounding the active layer and an element dispersion agent including a magnetic metal and bonded to an outer surface of the insulating film.

The element dispersion agent may include a ligand forming a coordination bond with the magnetic metal and a first functional group bonded to the ligand.

The ligand may be one of a porphyrin structure and a multi-dentate structure, and the magnetic metal may be one of Fe, Co, Ni, Mn, and Cr.

The first functional group may form a chemical bond with the insulating film.

The first functional group may be at least one of a silane group, a boronate group, a carboxylic acid group, an amine group, a thiol group, and a phosphoric acid group.

The element dispersion agent may further include at least one second functional group including a hydrophobic functional group and bonded to the ligand.

The at least one second functional group may include at least one of an alkyl group having 1 to 6 carbon atoms, a fluoroalkyl group having 1 to 6 carbon atoms, and a cycloalkyl group having 3 to 6 carbon atoms.

The element dispersion agent may have a structure represented by one of Chemical Formulas A to D below,

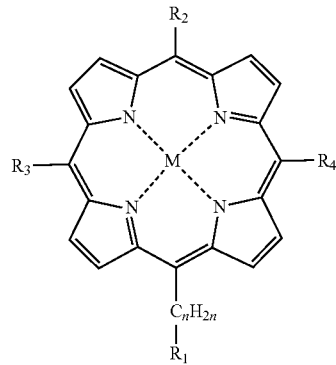

[Chemical Formula A]

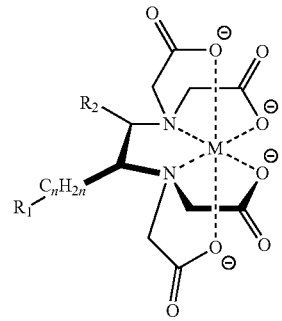

[Chemical Formula B]

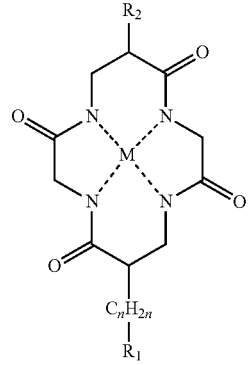

[Chemical Formula C]

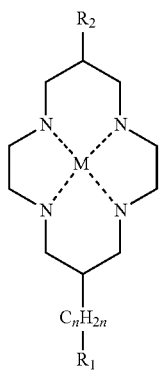

[Chemical Formula D]

wherein M is at least one of $Fe^{2+}$, $Mn^{2+}$, $CO^{2+}$, $Ni^{2+}$, and $Cr^{2+}$, $R_1$ is at least one of a silane group, a boronate group, a carboxylic acid group, an amine group, a thiol group, and a phosphoric acid group, each of $R_2$ to $R_4$ is independently one of hydrogen, an alkyl group having 1 to 6 carbon atoms, a fluoroalkyl group having 1 to 6 carbon atoms, and a cycloalkyl group having 3 to 6 carbon atoms, n is an integer of 1 to 6, and a dash line indicates a coordination bond.

According to an embodiment of the disclosure, a display device comprises a first electrode, and a second electrode that is spaced apart from and faces the first electrode, and a light-emitting element disposed between the first electrode and the second electrode, wherein the light-emitting element includes: a first semiconductor layer doped with a first polarity, a second semiconductor layer doped with a second polarity different from the first polarity, an active layer disposed between the first semiconductor layer and the second semiconductor layer, and an insulating layer surrounding at least an outer surface of the active layer. The insulating layer includes an insulating film and an element dispersion agent including a magnetic metal and bonded to an outer surface of the insulating film.

The element dispersion agent may include a ligand forming a coordination bond with the magnetic metal, a first functional group bonded to the ligand to form a chemical bond with the insulating film, and at least one second functional group including a hydrophobic functional group and bonded to the ligand.

The element dispersion agent may have a structure represented by one of the Chemical Formulas A to D above.

The display device may further comprise a first insulating layer disposed between the first electrode and the second electrode and covering at least a portion of each of the first electrode and the second electrode, and a second insulating layer disposed on the first insulating layer between the first electrode and the second electrode, wherein the light-emitting element may be disposed on the first insulating layer and the second insulating layer.

The element dispersion agent of the light-emitting element may directly contact with the first insulating layer and the second insulating layer.

According to an embodiment of the disclosure, a method of manufacturing a display device, the method comprises preparing an ink in which light-emitting elements each including a semiconductor core and an insulating layer surrounding the semiconductor core are dispersed, and applying a magnetic field to the light-emitting elements, preparing a target substrate on which a first electrode and a second electrode spaced apart from each other are formed, and spraying the ink in which the light-emitting elements are dispersed onto the target substrate, and disposing the light-emitting elements between the first electrode and the second electrode by generating an electric field on the target substrate.

The semiconductor core may include a first semiconductor layer doped with a first polarity, a second semiconductor layer doped with a second polarity different from the first polarity, an active layer disposed between the first semiconductor layer and the second semiconductor layer, and an insulating layer surrounding at least an outer surface of the active layer, wherein the insulating layer may include an insulating film and an element dispersion agent including a magnetic metal and bonded to an outer surface of the insulating film.

The method may further comprise applying a magnetic force to the magnetic metal of the element dispersion agent by the magnetic field. In the applying of the magnetic field, the magnetic force may be transmitted to the light-emitting elements in a direction opposite to a gravity direction.

The ink may be sprayed onto the target substrate in a state in which the magnetic field is applied.

In the disposing of the light-emitting elements by the electric field, one end portion of each of the light-emitting elements may be disposed on the first electrode and the other end portion thereof is disposed on the second electrode.

The element dispersion agent may include a ligand forming a coordination bond with the magnetic metal, a first functional group bonded to the ligand to form a chemical bond with the insulating film, and at least one second functional group including a hydrophobic functional group and bonded to the ligand.

The element dispersion agent may have a structure represented by one of the Chemical Formulas A to D above.

A light-emitting element according to an embodiment includes a semiconductor core and an insulating layer surrounding the semiconductor core, and the insulating layer includes an insulating film and an element dispersion agent bonded to an outer surface of the insulating film. The element dispersion agent includes a magnetic metal and a ligand capable of forming a coordination bond with the magnetic metal. A magnetic force can be applied to the magnetic metal by a magnetic field, and the magnetic force received by the magnetic metal can be transmitted to the light-emitting element, and thus a rate at which the light-emitting element is precipitated in an ink can be reduced.

Accordingly, during a manufacturing process of a display device including the light-emitting element, the light-emitting elements can be sprayed by an inkjet printing process in a state in which the light-emitting elements are uniformly dispersed in the ink, and the sprayed ink can include a uniform number of light-emitting elements.

Further, in a display device according to an embodiment, a uniform number of light-emitting elements can be disposed for each pixel by the above-described manufacturing process.

The effects according to the embodiments are not limited by the contents exemplified above, and more various effects are included in this disclosure.

BRIEF DESCRIPTION OF DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

Figure 1:
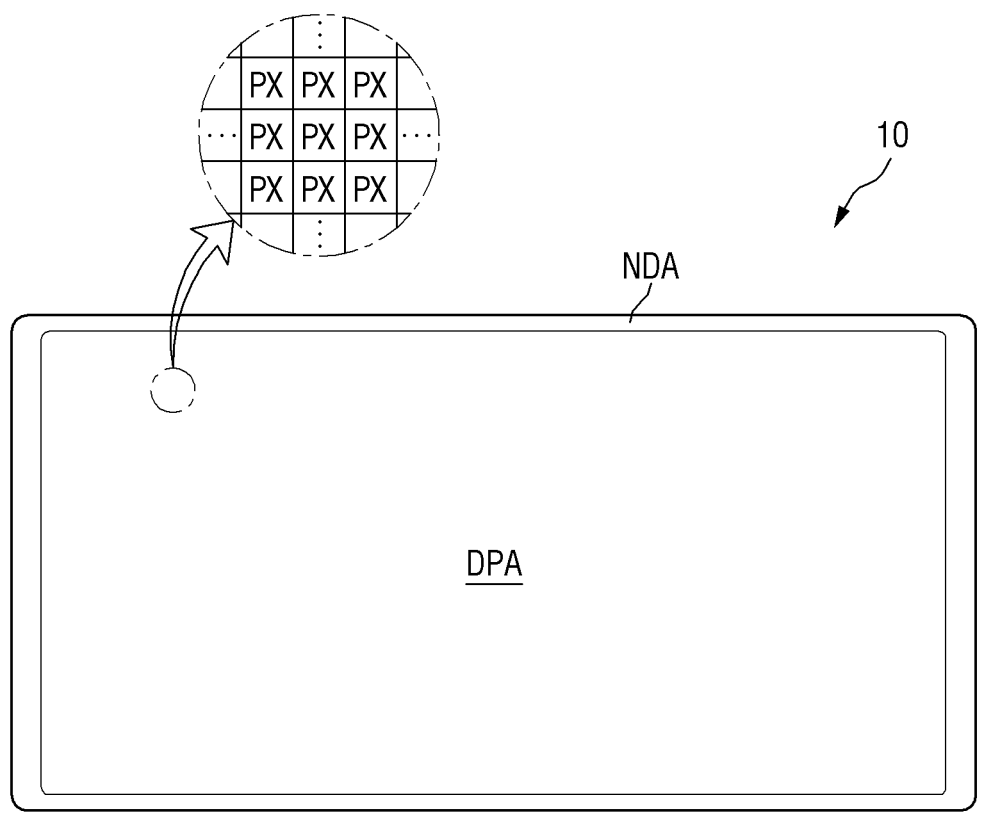
FIG. 1 is a schematic plan view of a display device according to an embodiment.
Figure 1:
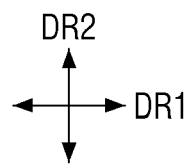

FIG. 1 is a schematic plan view of a display device according to an embodiment.

Referring to FIG. 1, a display device 10 displays a video or a still image. The display device 10 may refer to all electronic devices that provide a display screen. For example, the display device 10 may include a television, a notebook (or laptop), a monitor, an advertising board, an Internet of Things (IoT) device, a mobile phone, a smartphone, a tablet personal computer (PC), an electronic watch, a smartwatch, a watch phone, a head-mounted display, a mobile communication terminal, an electronic organizer, an electronic-book reader, a portable multimedia player (PMP), a navigation device, a game machine, a digital camera, a camcorder, and the like, which provide a display screen.

The display device 10 includes a display panel that displays an image. Examples of the display panel may include an inorganic light-emitting diode (LED) display panel, an organic light-emitting display panel, a quantum dot light-emitting display panel, a plasma display panel, a field emission display panel, and the like. Hereinafter, although an example in which the inorganic LED display panel as an example of the display panel is applied is described, the disclosure is not limited thereto, and in case that the same technical spirit is applicable thereto, it may be applied to other display panels.

A shape of the display device 10 may be variously modified. For example, the display device 10 may have shapes such as a rectangular shape of which lateral sides are long, a rectangular shape of which longitudinal sides are long, a square shape, a quadrangular shape of which corner portions (vertexes) are round, other polygonal shapes, a circular shape, and the like. A shape of a display area DPA of the display device 10 may also be similar to the overall shape of the display device 10. FIG. 1 illustrates the display device 10 and the display area DPA which have a rectangular shape of which lateral sides are long.

The display device 10 may include the display area DPA and a non-display area NDA. The display area DPA is an area in which an image may be displayed, and the non-display area NDA is an area in which an image is not displayed. The display area DPA may refer to an active area and the non-display area NDA may refer to an inactive area. The display area DPA may generally occupy a center of the display device 10.

The display area DPA may include pixels PX. The pixels PX may be disposed in a matrix shape. A shape of each of the pixels PX may be a rectangular shape or a square shape in a plan view, but the disclosure is not limited thereto, and the shape may be a rhombic shape of which each side is inclined with respect to a direction. The pixels PX may be alternately disposed in a stripe type or a PenTile® type. In addition, each of the pixels PX may include one or more light-emitting elements 300 that emit light in a specific wavelength range, thereby displaying a specific color.

The non-display area NDA may be disposed around the display area DPA. The non-display area NDA may completely or partially surround the display area DPA. The display area DPA has a rectangular shape, and the non-display area NDA may be disposed adjacent to four sides of the display area DPA. The non-display area NDA may form a bezel of the display device 10. In each non-display area NDA, lines or circuit driving parts included in the display device 10 may be disposed, or external devices may be mounted.

Figure 2:
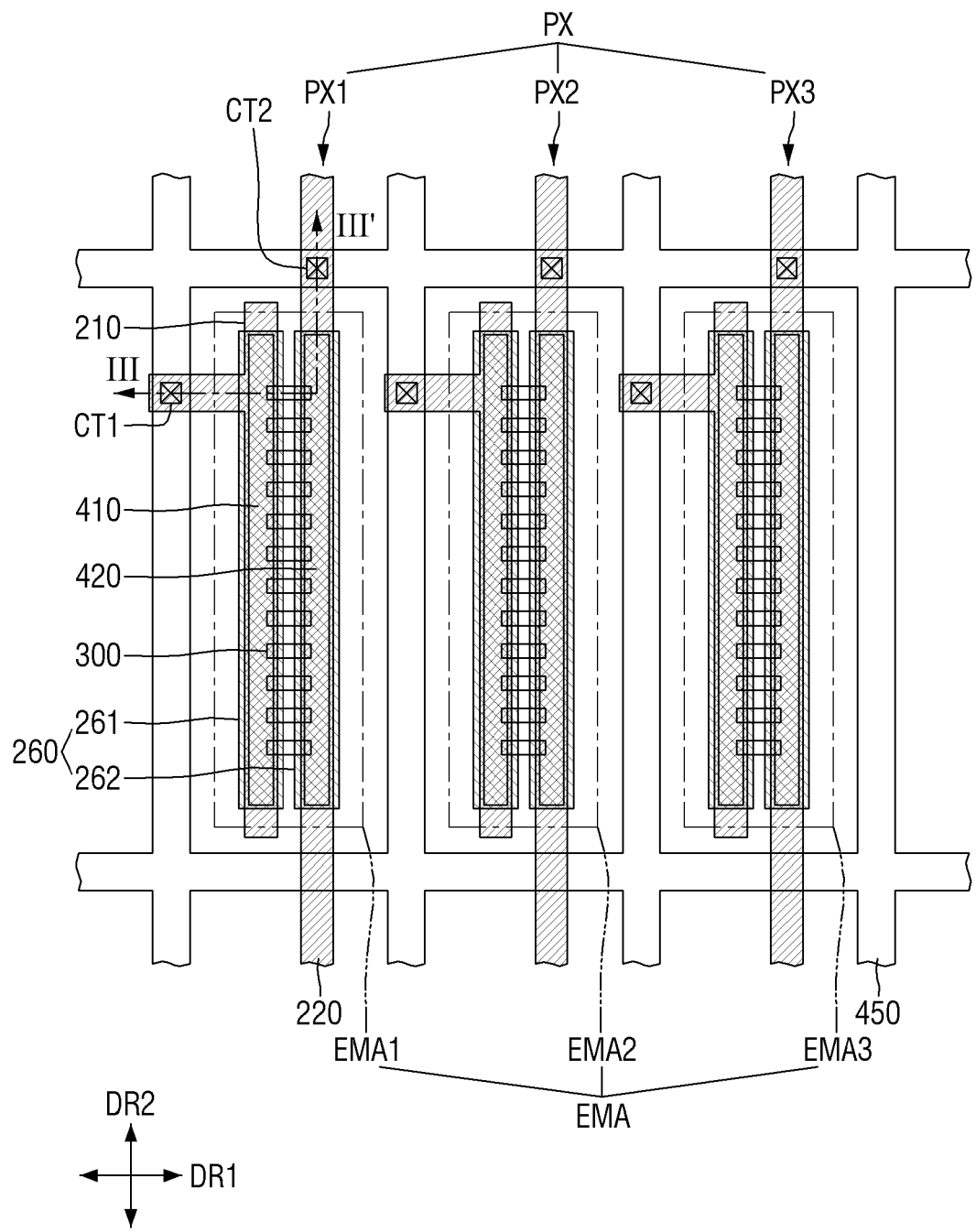
FIG. 2 is a schematic plan view illustrating one pixel of the display device according to an embodiment.
Figure 3:
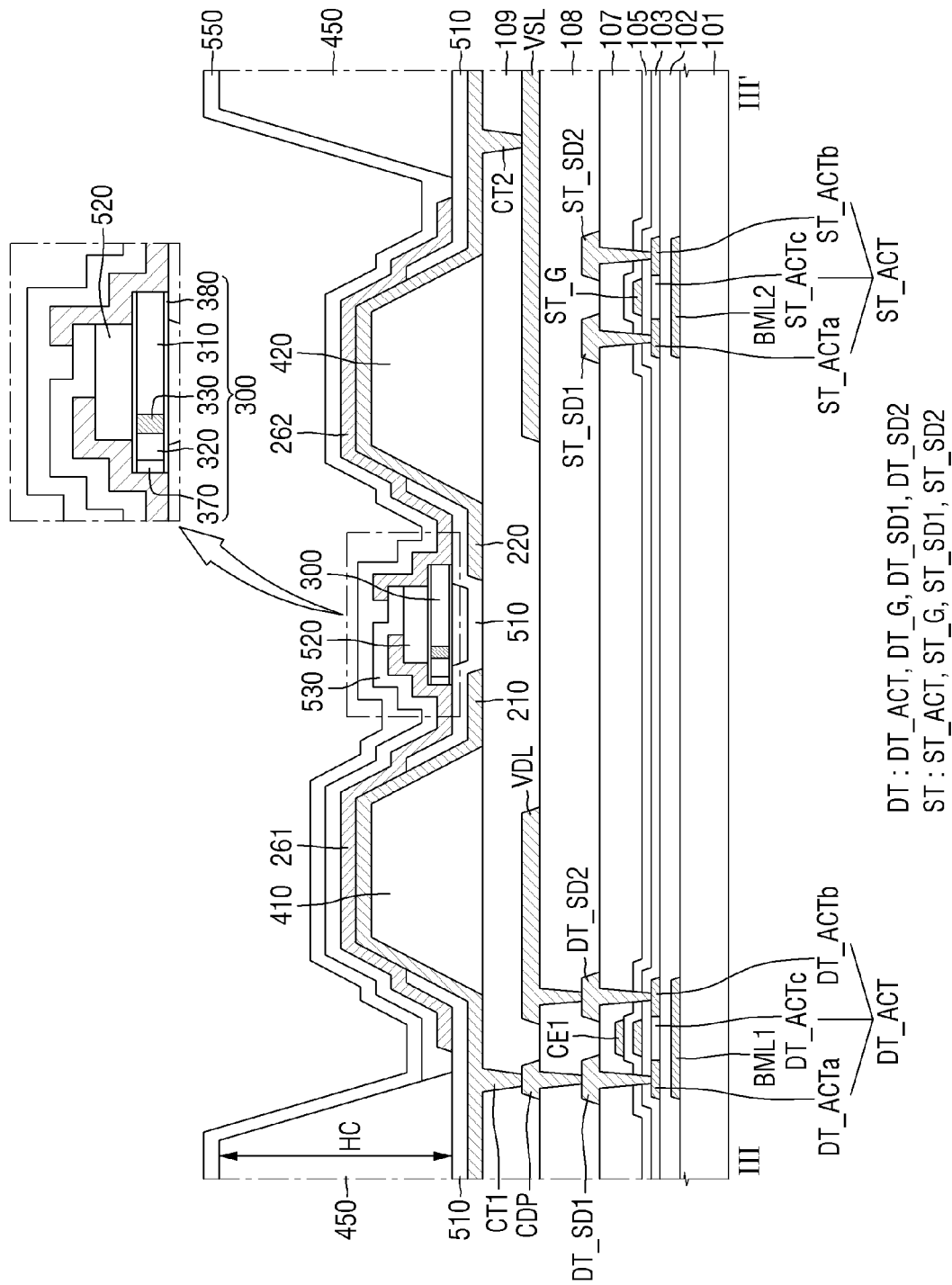
FIG. 3 is a schematic cross-sectional view taken along line III-III' of FIG. 2.

FIG. 2 is a schematic plan view illustrating a pixel of the display device according to an embodiment. FIG. 3 is a schematic cross-sectional view taken along line III-III' of FIG. 2.

Referring to FIG. 2, each of the pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red. However, the disclosure is not limited thereto, and the sub-pixels PXn may emit light having a same color, where n is a natural number. In addition, FIG. 2 illustrates that the pixel PX includes three sub-pixels PXn, but the disclosure is not limited thereto, and the pixel PX may also include a larger number of sub-pixels PXn.

Each of the sub-pixels PXn of the display device 10 may include an area defined as a light-emitting area EMA. The first sub-pixel PX1 may include a first light-emitting area EMA1, the second sub-pixel PX2 may include a second light-emitting area EMA2, and the third sub-pixel PX3 may include a third light-emitting area EMA3. The light-emitting area EMA may be defined as an area in which the light-emitting element 300 included in the display device 10 is disposed to emit light in a specific wavelength range. The light-emitting element 300 includes an active layer 330 (see FIG. 4), and the active layer 330 may emit light in a specific wavelength range without directivity. The light emitted from the active layer 330 of the light-emitting element 300 may also be emitted in directions toward side surfaces of the light-emitting element 300 including ends. The light-emitting area EMA may include an area in which the light-emitting element 300 is disposed, and may include an area which is adjacent to the light-emitting element 300 and through which the light emitted from the light-emitting element 300 is emitted.

However, the disclosure is not limited thereto, and the light-emitting area EMA may also include an area in which light emitted from the light-emitting element 300 is reflected or refracted by another member to be emitted. Light-emitting elements 300 may be disposed in each sub-pixel PXn, and the area in which the light-emitting elements 300 are disposed and an area adjacent to the area form the light-emitting area EMA.

Although not shown in the drawing, each of the sub-pixels PXn of the display device 10 may include a non-light-emitting area which is defined as an area except for the light-emitting area EMA. The non-light-emitting area may be an area in which the light-emitting elements 300 are not disposed and which light emitted from the light-emitting elements 300 does not reach so that light is not emitted.

FIG. 3 illustrates only a cross section of the first sub-pixel PX1 of FIG. 2, but the cross section may be identically applied to other pixels PX or sub-pixels PXn. FIG. 3 illustrates a cross section traversing from a first end portion (or one end portion) to a second end portion (or the other end portion) of the light-emitting element 300 disposed in the first sub-pixel PX1 of FIG. 2.

Referring to FIG. 3 in conjunction with FIG. 2, the display device 10 may include a circuit element layer and a display element layer disposed on a first substrate 101. A semiconductor layer, conductive layers, and insulating layers are disposed on the first substrate 101, each of which may form the circuit element layer and the display element layer. The conductive layers may include a first gate conductive layer, a second gate conductive layer, a first data conductive layer, and a second data conductive layer disposed below a first planarization layer 109 to form the circuit element layer, and electrodes 210 and 220 and contact electrodes 260 disposed on the first planarization layer 109 to form the display element layer. The insulating layers may include a buffer layer 102, a first gate insulating layer 103, a first protective layer 105, a first interlayer insulating layer 107, a second interlayer insulating layer 108, the first planarization layer 109, a first insulating layer 510, a second insulating layer 520, a third insulating layer 530, a fourth insulating layer 550, and the like.

The circuit element layer may include circuit elements and lines for driving the light-emitting element 300, such as a driving transistor DT, a switching transistor ST, a first conductive pattern CDP, and voltage lines VDL and VSL, and the display element layer may include the light-emitting element 300 and include a first electrode 210, a second electrode 220, a first contact electrode 261, a second contact electrode 262, and the like.

The first substrate 101 may be an insulating substrate. The first substrate 101 may be made of an insulating material such as glass, quartz, a polymer resin, or the like. In addition, the first substrate 101 may be a rigid substrate but may also be a flexible substrate that is bendable, foldable, rollable, or the like.

Light-blocking layers BML1 and BML2 may be disposed on the first substrate 101. The light-blocking layers BML1 and BML2 may include a first light-blocking layer BML1 and a second light-blocking layer BML2. The first light-blocking layer BML1 and the second light-blocking layer BML2 are disposed to at least respectively overlap a first active layer (or first active material layer) DT_ACT of the driving transistor DT and a second active layer (or second active material layer) ST_ACT of the switching transistor ST. The light-blocking layers BML1 and BML2 may include light-blocking materials to prevent light from being incident on the first and second active layers DT_ACT and ST_ACT. As an example, the first and second light-blocking layers BML1 and BML2 may be made of opaque metal materials that block light from being transmitted. However, the disclosure is not limited thereto, and in some embodiments, the light-blocking layers BML1 and BML2 may be omitted. Although not shown in the drawing, the first light-blocking layer BML1 may be electrically connected to a first source/drain electrode DT_SD1 of the driving transistor DT, which will be described below, and the second light-blocking layer BML2 may be electrically connected to a first source/drain electrode ST_SD1 of the switching transistor ST.

The buffer layer 102 may be disposed entirely on the light-blocking layers BML1 and BML2 and the first substrate 101. The buffer layer 102 may be formed on the first substrate 101 to protect the driving and switching transistors DT and ST of the pixel PX from moisture permeating through the first substrate 101 that is vulnerable to moisture permeation, and may perform a surface planarization function. The buffer layer 102 may be formed as inorganic layers that are alternately stacked. For example, the buffer layer 102 may be formed as multiple layers in which inorganic layers including at least one of silicon oxide ($SiO_x$), silicon nitride ($SiN_x$), and silicon oxynitride (SiON) are alternately stacked.

The semiconductor layer is disposed on the buffer layer 102. The semiconductor layer may include the first active layer DT_ACT of the driving transistor DT and the second active layer ST_ACT of the switching transistor ST. The first active layer DT_ACT and the second active layer ST_ACT may be disposed to partially overlap gate electrodes DT_G and ST_G or the like of a first gate conductive layer to be described below.

In an embodiment, the semiconductor layer may include polycrystalline silicon, monocrystalline silicon, an oxide semiconductor, and the like. The polycrystalline silicon may be formed by crystallizing amorphous silicon. Examples of the crystallization method may include a rapid thermal annealing (RTA) method, a solid phase crystallization (SPC) method, an excimer laser annealing (ELA) method, a metal induced lateral crystallization (MILC) method, and a sequential lateral solidification (SLS) method, and the like, but the disclosure is not limited thereto. In case that the semiconductor layer includes polycrystalline silicon, the first active layer DT_ACT may include a first doped area DT_ACTa, a second doped area DT_ACTb, and a first channel area DT_ACTc. The first channel area DT_ACTc may be disposed between the first doped area DT_ACTa and the second doped area DT_ACTb. The second active layer ST_ACT may include a third doped area ST_ACTa, a fourth doped area ST_ACTb, and a second channel area ST_ACTc. The second channel area ST_ACTc may be disposed between the third doped area ST_ACTa and the fourth doped area ST_ACTb. The first doped area DT_ACTa, the second doped area DT_ACTb, the third doped area ST_ACTa, and the fourth doped area ST_ACTb may be areas in which partial areas of the first active layer DT_ACT and the second active layer ST_ACT are doped with impurities.

In an embodiment, the first active layer DT_ACT and the second active layer ST_ACT may include an oxide semiconductor. In this case, the doped area of each of the first active layer DT_ACT and the second active layer ST_ACT may be an area that has become conductive. The oxide semiconductor may be an oxide semiconductor including indium (In). In some embodiments, the oxide semiconductor may include indium-tin oxide (ITO), indium-zinc oxide (IZO), indium-gallium oxide (IGO), indium-zinc-tin oxide (IZTO), indium-gallium-tin oxide (IGTO), indium-gallium-zinc-tin oxide (IGZTO), or the like. However, the disclosure is not limited thereto.

The first gate insulating layer 103 is disposed on the semiconductor layer and the buffer layer 102. The first gate insulating layer 103 may be disposed on the buffer layer 102, including the semiconductor layer. The first gate insulating layer 103 may serve as gate insulating layers of the driving transistor DT and the switching transistor ST. The first gate insulating layer 103 may be formed as an inorganic layer including an inorganic material such as silicon oxide ($SiO_x$), silicon nitride ($SiN_x$), and silicon oxynitride (SiON), or as a stacked structure thereof.

The first gate conductive layer is disposed on the first gate insulating layer 103. The first gate conductive layer may include a first gate electrode DT_G of the driving transistor DT and a second gate electrode ST_G of the switching transistor ST. The first gate electrode DT_G is disposed to overlap at least a partial area of the first active layer DT_ACT, and the second gate electrode ST_G is disposed to overlap at least a partial area of the second active layer ST_ACT. For example, the first gate electrode DT_G may be disposed to overlap the first channel area DT_ACTc of the first active layer DT_ACT in a thickness direction, and the second gate electrode ST_G may be disposed to overlap the second channel area ST_ACTc of the second active layer ST_ACT in the thickness direction.

The first gate conductive layer may be formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

The first protective layer 105 is disposed on the first gate conductive layer. The first protective layer 105 may be disposed to cover the first gate conductive layer and may perform a function of protecting the first gate conductive layer. The first protective layer 105 may be formed as an inorganic layer including an inorganic material such as silicon oxide ($SiO_x$), silicon nitride ($SiN_x$), and silicon oxynitride (SiON), or as a stacked structure thereof.

A second gate conductive layer is disposed on the first protective layer 105. The second gate conductive layer may include a first capacitor electrode CE1 of a storage capacitor disposed so that at least a partial area thereof overlaps the first gate electrode DT_G in the thickness direction. The first capacitor electrode CE1 and the first gate electrode DT_G may overlap each other in the thickness direction with the first protective layer 105 interposed therebetween, and the storage capacitor may be formed therebetween. The second gate conductive layer may be formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

The first interlayer insulating layer 107 is disposed on the second gate conductive layer. The first interlayer insulating layer 107 may serve as an insulating layer between the second gate conductive layer and other layers disposed thereon. The first interlayer insulating layer 107 may be formed as an inorganic layer including an inorganic material such as silicon oxide ($SiO_x$), silicon nitride ($SiN_x$), and silicon oxynitride (SiON), or as a stacked structure thereof.

The first data conductive layer is disposed on the first interlayer insulating layer 107. The first gate conductive layer may include the first source/drain electrode DT_SD1 and a second source/drain electrode DT_SD2 of the driving transistor DT, and the first source/drain electrode ST_SD1 and a second source/drain electrode ST_SD2 of the switching transistor ST.

The first source/drain electrode DT_SD1 and the second source/drain electrode DT_SD2 of the driving transistor DT may respectively contact the first doped area DT_ACTa and the second doped area DT_ACTb of the first active layer DT_ACT through contact holes passing through the first interlayer insulating layer 107 and the first gate insulating layer 103. The first source/drain electrode ST_SD1 and the second source/drain electrode ST_SD2 of the switching transistor ST may respectively contact the third doped area ST_ACTa and the fourth doped area ST_ACTb of the second active layer ST_ACT through contact holes passing through the first interlayer insulating layer 107 and the first gate insulating layer 103. In addition, the first source/drain electrode DT_SD1 of the driving transistor DT and the first source/drain electrode ST_SD1 of the switching transistor ST may be electrically connected to the first light-blocking layer BML1 and the second light-blocking layer BML2, respectively, through other contact holes. For the first source/drain electrodes DT_SD1 and ST_SD1 and the second source/drain electrodes DT_SD2 and ST_SD2 of the driving transistor DT and the switching transistor ST, in case that one electrode is a source electrode, the other electrode may be a drain electrode. However, the disclosure is not limited thereto, and for the first source/drain electrodes DT_SD1 and ST_SD1 and the second source/drain electrodes DT_SD2 and ST_SD2, in case that one electrode is a drain electrode, the other electrode may be a source electrode.

The first data conductive layer may be formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

The second interlayer insulating layer 108 may be disposed on the first data conductive layer. The second interlayer insulating layer 108 may be disposed entirely on the first interlayer insulating layer 107 while covering the first data conductive layer and may sever to protect the first data conductive layer. The second interlayer insulating layer 108 may be formed as an inorganic layer including an inorganic material such as silicon oxide ($SiO_x$), silicon nitride ($SiN_x$), and silicon oxynitride (SiON), or as a stacked structure thereof.

The second data conductive layer is disposed on the second interlayer insulating layer 108. The second data conductive layer may include a second voltage line VSL, a first voltage line VDL, and the first conductive pattern CDP. A high-potential voltage (a first power voltage) to be supplied to the driving transistor DT may be applied to the first voltage line VDL, and a low-potential voltage (a second power voltage) to be supplied to the second electrode 220 may be applied to the second voltage line VSL. During the manufacturing process of the display device 10, an alignment signal necessary to align the light-emitting element 300 may be applied to the second voltage line VSL.

The first conductive pattern CDP may be electrically connected to the first source/drain electrode DT_SD1 of the driving transistor DT through a contact hole formed in the second interlayer insulating layer 108. The first conductive pattern CDP may also contact the first electrode 210, which will be described below, and the driving transistor DT may transmit the first power voltage applied from the first voltage line VDL, to the first electrode 210 through the first conductive pattern CDP. FIG. 3 illustrates that the second data conductive layer includes a first voltage line VDL and a second voltage line VSL, but the disclosure is not limited thereto. The second data conductive layer may include a larger number of first voltage lines VDL and a larger number of second voltage lines VSL.

The second data conductive layer may be formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

The first planarization layer 109 is disposed on the second data conductive layer. The first planarization layer 109 may include an organic insulating material, for example, an organic material such as polyimide (PI), and may perform a surface planarization function.

Inner banks 410 and 420, electrodes 210 and 220, an outer bank 450, contact electrodes 260, and the light-emitting element 300 are disposed on the first planarization layer 109. Further, insulating layers 510, 520, 530, and 550 may be further disposed on the first planarization layer 109.

The inner banks 410 and 420 are disposed directly on the first planarization layer 109. The inner banks 410 and 420 may include a first inner bank 410 and a second inner bank 420 disposed adjacent to a center portion of each pixel PX or sub-pixel PXn.

As shown in FIG. 2, the first inner bank 410 and the second inner bank 420 may be disposed to be spaced apart from each other and face each other in a first direction DR1. In addition, the first inner bank 410 and the second inner bank 420 may extend in a second direction DR2, and may be spaced apart from each other and terminated at a boundary between the sub-pixels PXn so as not to extend to another sub-pixel PXn adjacent in the second direction DR2. Accordingly, the first inner bank 410 and the second inner bank 420 may be disposed in each sub-pixel PXn to form a pattern on the entire surface of the display device 10. By disposing the inner banks 410 and 420 to be spaced apart from each other and face each other, an area in which the light-emitting element 300 is disposed may be formed therebetween. FIG. 2 illustrates that a first inner bank 410 and a second inner bank 420 are disposed, but the disclosure is not limited thereto. In some embodiments, multiple inner banks 410 and 420 may be disposed or larger numbers of inner banks 410 and 420 may be further disposed according to the numbers of the electrodes 210 and 220, which will be described below.

Further, as shown in FIG. 3, each of the first inner bank 410 and the second inner bank 420 may have a structure in which at least a portion thereof protrudes with respect to (or protrudes from) an upper surface of the first planarization layer 109. The protruding portion of each of the first inner bank 410 and the second inner bank 420 may have inclined side surfaces, and light emitted from the light-emitting element 300 disposed between the first inner bank 410 and the second inner bank 420 may travel toward the inclined side surfaces of the inner banks 410 and 420. As will be described below, in case that the electrodes 210 and 220 respectively disposed on the inner banks 410 and 420 include a material having a high reflectance, the light emitted from the light-emitting element 300 may be reflected from the side surfaces of the inner banks 410 and 420 to be emitted upward from the first substrate 101. For example, the inner banks 410 and 420 may provide an area in which the light-emitting element 300 is disposed, and simultaneously may serve as a reflective partition wall that reflects the light emitted from the light-emitting element 300 upward. In an embodiment, the inner banks 410 and 420 may include an organic insulating material such as polyimide (PI), but the disclosure is not limited thereto.

The electrodes 210 and 220 are disposed on the inner banks 410 and 420 and the first planarization layer 109. The electrodes 210 and 220 may include the first electrode 210 disposed on the first inner bank 410 and the second electrode 220 disposed on the second inner bank 420.

As shown in FIG. 2, the first electrode 210 may be disposed in each sub-pixel PXn in a form extending in the second direction DR2. However, the first electrode 210 may not extend to another sub-pixel PXn adjacent in the second direction DR2, and may be disposed to be partially spaced apart from the outer bank 450 surrounding each sub-pixel PXn. At least a partial area of the first electrode 210 is disposed to overlap the outer bank 450, and the first electrode 210 may be electrically connected to the driving transistor DT in an area overlapping the outer bank 450. For example, the first electrode 210 may contact the first conductive pattern CDP through a first contact hole CT1 formed in an area overlapping the outer bank 450, and passing through the first planarization layer 109, and through this, the first electrode 210 may be electrically connected to the first source/drain electrode DT_SD1 of the driving transistor DT.

The second electrode 220 may be disposed to extend in the second direction DR2 in each sub-pixel PXn. Unlike the first electrode 210, the second electrode 220 may be disposed to extend to another sub-pixel PXn adjacent to the sub-pixel PXn in the second direction DR2. For example, an electrically connected second electrode 220 may be disposed in the sub-pixels PXn adjacent to each other in the second direction DR2. The second electrode 220 may partially overlap the outer bank 450 at a boundary between the sub-pixels PXn adjacent to each other in the second direction DR2, and the second electrode 220 may be electrically connected to the second voltage line VSL in an area overlapping the outer bank 450. For example, the second electrode 220 may contact the second voltage line VSL through a second contact hole CT2 formed in an area overlapping the outer bank 450, and passing through the first planarization layer 109. As shown in the drawing, the second electrodes 220 of the sub-pixels PXn adjacent to each other in the first direction DR1 are electrically connected to the second voltage lines VSL through the second contact holes CT2, respectively.

However, the disclosure is not limited thereto. In some embodiments, each of the first electrode 210 and the second electrode 220 may further include a stem portion extending in the first direction DR1. In the first electrode 210, different stem portions may be disposed for each sub-pixel PXn, and in the second electrode 220, a stem portion extends to the sub-pixels PXn adjacent to the sub-pixel PXn in the first direction DR1 so that the second electrodes 220 of the sub-pixels PXn may be electrically connected to each other by the stem portion. In this case, the second electrode 220 may be electrically connected to the second voltage line VSL in the non-display area NDA located at a peripheral portion of the display area DPA in which the pixels PX or sub-pixels PXn are disposed.

FIG. 2 illustrates that a first electrode 210 and a second electrode 220 are disposed in each sub-pixel PXn, but the disclosure is not limited thereto. In some embodiments, larger numbers of first electrodes 210 and second electrodes 220 may be disposed in each sub-pixel PXn. In addition, the first electrode 210 and the second electrode 220 disposed in each sub-pixel PXn may not necessarily have a shape extending in one direction, and the first electrode 210 and the second electrode 220 may be disposed in various structures. For example, the first electrode 210 and the second electrode 220 may each have a partially curved or bent shape, and one of the first electrode 210 and the second electrode 220 may be disposed to surround the other thereof. As long as at least a partial area of each of the first electrode 210 and at least a partial area of the second electrode 220 are spaced apart from each other and face each other to form an area in which the light-emitting element 300 is to be disposed therebetween, the arrangement structures and shapes of the first electrode 210 and the second electrode 220 are not particularly limited.

The electrodes 210 and 220 may be electrically connected to the light-emitting elements 300 and may receive a voltage to allow the light-emitting element 300 to emit light. For example, the electrodes 210 and 220 may be electrically connected to the light-emitting element 300 through the contact electrodes 260, which will be described below, and may transmit an electrical signal applied to the electrodes 210 and 220 to the light-emitting element 300 through the contact electrodes 260.

In an embodiment, the first electrode 210 may be a pixel electrode separated for each sub-pixel PXn, and the second electrode 220 may be a common electrode electrically connected in common to each sub-pixel PXn. One of the first electrode 210 and the second electrode 220 may be an anode of the light-emitting element 300, and the other thereof may be a cathode of the light-emitting element 300. However, the disclosure is not limited thereto, and the reverse may be possible.

Further, each of the electrodes 210 and 220 may be utilized to form an electric field in the sub-pixel PXn, thereby aligning the light-emitting element 300. The light-emitting element 300 may be disposed between the first electrode 210 and the second electrode 220 by a process of forming an electric field between the first electrode 210 and the second electrode 220 by applying an alignment signal to the first electrode 210 and the second electrode 220. As will be described below, the light-emitting elements 300 may be sprayed onto the first electrode 210 and the second electrode 220 in a state of being dispersed in ink by an inkjet printing process, and may be aligned between the first electrode 210 and the second electrode 220 by a method of applying a dielectrophoretic force to the light-emitting elements 300 by applying the alignment signal between the first electrode 210 and the second electrode 220.

As shown in FIG. 3, the first electrode 210 and the second electrode 220 may be disposed on the first inner bank 410 and the second inner bank 420, respectively, and may be spaced apart from each other and may face each other in the first direction DR1. The light-emitting elements 300 may be disposed between the first inner bank 410 and the second inner bank 420, and the light-emitting element 300 may be disposed between the first electrode 210 and the second electrode 220, and at least one first end portion of the light-emitting element 300 may be electrically connected to the first electrode 210 and the second electrode 220.

In some embodiments, the first electrode 210 and the second electrode 220 may be formed to have greater widths than the first inner bank 410 and the second inner bank 420, respectively. For example, the first electrode 210 and the second electrode 220 may be disposed to cover outer surfaces of the first inner bank 410 and the second inner bank 420, respectively. The first electrode 210 and the second electrode 220 may be disposed on side surfaces of the first inner bank 410 and the second inner bank 420, respectively, and a distance (or separation distance) between the first electrode 210 and the second electrode 220 may be less than a distance between the first inner bank 410 and the second inner bank 420. In addition, at least a partial area of each of the first electrode 210 and the second electrode 220 may be disposed directly on the first planarization layer 109.

Each of the electrodes 210 and 220 may include a transparent conductive material. As an example, each of the electrodes 210 and 220 may include materials such as indium tin oxide (ITO), indium zinc oxide (IZO), indium tin-zinc oxide (ITZO), and the like, but the disclosure is not limited thereto. In some embodiments, each of the electrodes 210 and 220 may include a conductive material having high reflectance. For example, each of the electrodes 210 and 220 may include a metal such as silver (Ag), copper (Cu), aluminum (Al), or the like as the material having high reflectance. In this case, each of the electrodes 210 and 220 may reflect light, which is emitted from the light-emitting element 300 and travels to the side surfaces of the first inner bank 410 and the second inner bank 420, in an upward direction with respect to each sub-pixel PXn.

However, the disclosure is not limited thereto, and each of the electrodes 210 and 220 may be formed as a structure, in which one or more layers of a transparent conductive material and a metal layer having high reflectance are stacked, or formed as a single layer including the transparent conductive material and the metal layer. In an embodiment, each of the electrodes 210 and 220 may have a stacked structure of ITO/Ag/ITO/IZO or may be an alloy including Al, Ni, lanthanum (La), and the like.

The first insulating layer 510 is disposed on the first planarization layer 109, the first electrode 210, and the second electrode 220. The first insulating layer 510 may be disposed on a side opposite to the area between the inner banks 410 and 420 with respect to the inner banks 410 and 420 as well as in the area between the electrodes 210 and 220 or between the inner banks 410 and 420 being spaced apart from each other. In addition, the first insulating layer 510 is disposed to partially cover the first electrode 210 and the second electrode 220. For example, the first insulating layer 510 may be disposed entirely on the first electrode 210, the second electrode 220, and the first planarization layer 109, and may be disposed to expose a portion of an upper surface of each of the first electrode 210 and the second electrode 220. An opening (not shown) partially exposing the first electrode 210 and the second electrode 220 may be formed in the first insulating layer 510, and the first insulating layer 510 may be disposed to cover only a first side and a second side of each of the first electrode 210 and the second electrode 220. Some of the first electrode 210 and the second electrode 220, which are disposed on the inner banks 410 and 420, may be partially exposed by the opening.

The first insulating layer 510 may protect the first electrode 210 and the second electrode 220 and insulate the first electrode 210 from the second electrode 220 from each other. In addition, the first insulating layer 510 may prevent the light-emitting element 300, disposed on the first insulating layer 510, from being damaged by directly contacting other members. However, the shape and structure of the first insulating layer 510 are not limited thereto.

In an embodiment, a stepped portion may be formed on a portion of an upper surface of the first insulating layer 510 between the first electrode 210 and the second electrode 220. In some embodiments, the first insulating layer 510 may include an inorganic insulating material, and a portion of the upper surface of the first insulating layer 510 disposed to partially cover the first electrode 210 and the second electrode 220 may be stepped by the stepped portion that is formed by the electrodes 210 and 220 disposed below the first insulating layer 510. Accordingly, an empty space may be formed between the light-emitting element 300, which is disposed on the first insulating layer 510 between the first electrode 210 and the second electrode 220, and the upper surface of the first insulating layer 510. The empty space may be filled with a material forming the second insulating layer 520, which will be described below.

However, the disclosure is not limited thereto. The first insulating layer 510 may be formed such that a portion thereof disposed between the first electrode 210 and the second electrode 220 has a flat upper surface. The upper surface extends in a direction toward the first electrode 210 and the second electrode 220, and the first insulating layer 510 may also be disposed in areas in which the electrodes 210 and 220 overlap the inclined side surfaces of the first inner bank 410 and the second inner bank 420, respectively. The contact electrodes 260, which will be described below, may contact the exposed areas of the first electrode 210 and the second electrode 220 and may smoothly contact end portions of the light-emitting element 300 on the flat upper surface of the first insulating layer 510.

The outer bank 450 may be disposed on the first insulating layer 510. As shown in FIGS. 2 and 3, the outer bank 450 may be disposed at a boundary between the sub-pixels PXn. The outer bank 450 may be disposed to extend at least in the second direction DR2 to surround the area in which the light-emitting element 300 is disposed between the inner banks 410 and 420 and between the electrodes 210 and 220, and some of the inner banks 410 and 420 and the electrodes 210 and 220. In addition, the outer bank 450 may further include a portion extending in the first direction DR1, and may form a grid pattern on the entire surface of the display area DPA.

According to an embodiment, a height of the outer bank 450 may be greater than a height of each of the inner banks 410 and 420. Unlike the inner banks 410 and 420, the outer bank 450 may divide adjacent sub-pixels PXn, and as will be described below, prevent the ink from overflowing into the adjacent sub-pixel PXn in the inkjet printing process for disposing the light-emitting element 300 during the manufacturing process of the display device 10. For example, the outer bank 450 may separate inks, in which different light-emitting elements 300 are dispersed, from each other in different sub-pixels PXn so as to prevent the inks from being mixed with each other. Similar to the inner banks 410 and 420, the outer bank 450 may include polyimide (PI), but the disclosure is not limited thereto.

The light-emitting element 300 may be disposed in an area formed between the first electrode 210 and the second electrode 220, or between the first inner bank 410 and the second inner bank 420. A first end portion of the light-emitting element 300 may be electrically connected to the first electrode 210, and a second end portion thereof may be electrically connected to the second electrode 220. The light-emitting element 300 may be electrically connected to the first electrode 210 and the second electrode 220, respectively, through the contact electrodes 260.

The light-emitting elements 300 may be disposed to be spaced apart from each other and aligned to be substantially parallel to each other. A distance between the light-emitting elements 300 is not particularly limited. In some embodiments, the light-emitting elements 300 may be disposed adjacent to each other to form a group and other light-emitting elements 300 may be grouped in a state of being spaced apart from each other at an interval, and may be oriented and aligned in a direction with a nonuniform density. In addition, in an embodiment, the light-emitting element 300 may have a shape extending in a direction, and a direction in which each of the electrodes 210 and 220 extends may be substantially perpendicular to a direction in which the light-emitting element 300 extends. However, the disclosure is not limited thereto, and the light-emitting element 300 may be obliquely disposed without being perpendicular to the direction in which each of the electrodes 210 and 220 extends.

The light-emitting elements 300 according to an embodiment may include active layers 330 having different materials to emit light in different wavelength ranges to the outside. The display device 10 according to an embodiment may include the light-emitting elements 300 emitting light in different wavelength ranges. The light-emitting element 300 of the first sub-pixel PX1 may include an active layer 330 that emits light of a first color having a first wavelength as a central wavelength band, the light-emitting element 300 of the second sub-pixel PX2 may include an active layer 330 that emits light of a second color having a second wavelength as a central wavelength band, and the light-emitting element 300 of the third sub-pixel PX3 may include an active layer 330 that emits light of a third color having a third wavelength as a central wavelength band.

Thus, the light of the first color may be emitted from the first sub-pixel PX1, the light of the second color may be emitted from the second sub-pixel PX2, and the light of the third color may be emitted from the third sub-pixel PX3. In some embodiments, the light of the first color may be blue light having a central wavelength band ranging from about 450 nm to about 495 nm, the light of the second color may be green light having a central wavelength band ranging from about 495 nm to about 570 nm, and the light of the third color may be red light having a central wavelength band ranging from about 620 nm to about 752 nm. However, the disclosure is not limited thereto. In some embodiments, the first sub-pixel PX1, the second sub-pixel PX2, and the third sub-pixel PX3 may include a same type of light-emitting elements 300 to emit light of a substantially same color.

The light-emitting element 300 may be disposed on an area between the inner banks 410 and 420 or on the first insulating layer 510 between the electrodes 210 and 220. For example, the light-emitting element 300 may be disposed on the first insulating layer 510 disposed between the inner banks 410 and 420. The light-emitting element 300 may be disposed such that an area thereof overlaps each of the electrodes 210 and 220 in the thickness direction. A first end portion of the light-emitting element 300 may overlap the first electrode 210 in the thickness direction and may be placed on the first electrode 210, and a second end portion thereof may overlap the second electrode 220 in the thickness direction and may be placed on the second electrode 220. However, the disclosure is not limited thereto, and although not shown in the drawing, at least some of the light-emitting elements 300 disposed in each sub-pixel PXn may be disposed in an area other than an area formed between the inner banks 410 and 420, for example, between the inner banks 410 and 420 and the outer bank 450.

The light-emitting element 300 may include layers disposed therein in a direction parallel to an upper surface of the first substrate 101 or the first planarization layer 109. The light-emitting element 300 of the display device 10 according to an embodiment may have a shape extending in a direction and have a structure in which semiconductor layers are sequentially disposed in a direction. The light-emitting element 300 may be disposed such that a direction, in which the light-emitting element 300 extends, is parallel to the first planarization layer 109, and the semiconductor layers included in the light-emitting element 300 may be sequentially disposed in the direction parallel to the upper surface of the first planarization layer 109. However, the disclosure is not limited thereto. In some embodiments, in case that the light-emitting element 300 has a different structure, the layers may be disposed in a direction perpendicular to the first planarization layer 109.

As described above, during the manufacturing process of the display device 10, the light-emitting elements 300 may be sprayed onto the first electrode 210 and the second electrode 220 by the inkjet printing process in a state of being dispersed in the ink. In case that an alignment signal is applied to the electrodes 210 and 220, an electric field is formed by the alignment signal so that the light-emitting elements 300 may receive a dielectrophoretic force to be aligned between the electrodes 210 and 220. Here, the light-emitting element 300 according to an embodiment may include semiconductor layers or an insulating layer 380 (see FIG. 4) surrounding a semiconductor core, and the insulating layer 380 may include an insulating film 381 (see FIG. 5) and an element dispersion agent 385 (see FIG. 5) including a magnetic metal and bonded to the insulating film 381.

A magnetic force may be applied to the magnetic metal included in the element dispersion agent 385 by a magnetic field applied thereto from the outside, and the magnetic force may be transmitted to the light-emitting element 300. According to a direction of the magnetic force, the light-emitting elements 300 may maintain a dispersed state in the ink for a long period of time. Accordingly, the light-emitting elements 300 according to an embodiment may maintain a dispersed state without being precipitated in the ink during the process of manufacturing the display device 10, and may have a uniform degree of dispersion in the ink sprayed onto the first electrode 210 and the second electrode 220. A detailed description of the structure of the light-emitting element 300 will be provided below with reference to other drawings.

The second insulating layer 520 may be partially disposed on the light-emitting element 300 disposed between the first electrode 210 and the second electrode 220. For example, the second insulating layer 520 may be disposed on the first insulating layer 510 between the first electrode 210 and the second electrode 220, and the light-emitting element 300 may be disposed between the first insulating layer 510 and the second insulating layer 520. In an embodiment, in the light-emitting element 300, the insulating layer 380 (see FIG. 4) formed on an outer surface of the light-emitting element 300 may directly contact the first insulating layer 510 and the second insulating layer 520. For example, the second insulating layer 520 may be disposed to partially surround the outer surface of the light-emitting element 300 and thus may protect the light-emitting element 300 and may fix the light-emitting element 300 during the manufacturing process of the display device 10. Accordingly, the element dispersion agent 385 of the light-emitting element 300 may directly contact each of the first insulating layer 510 and the second insulating layer 520.

A portion of the second insulating layer 520 disposed on the light-emitting element 300 may have a shape extending in the second direction DR2 between the first electrode 210 and the second electrode 220 in a plan view. As an example, the second insulating layer 520 may form a stripe or island type pattern in each sub-pixel PXn.

The second insulating layer 520 may be disposed on the light-emitting element 300 and may expose a first end portion and a second end portion of the light-emitting element 300. The exposed first or second end portion of the light-emitting element 300 may contact the contact electrode 260, which will be described below. Such a shape of the second insulating layer 520 may be formed by a patterning process using a material forming the second insulating layer 520 by using a mask process. A mask for forming the second insulating layer 520 has a width less than a length of the light-emitting element 300, and the material forming the second insulating layer 520 is patterned to expose opposite end portions of the light-emitting element 300. However, the disclosure is not limited thereto.

Further, in an embodiment, a portion of the material of the second insulating layer 520 may be disposed between the first insulating layer 510 and a lower surface of the light-emitting element 300. The second insulating layer 520 may be formed to fill a space between the first insulating layer 510 and the light-emitting element 300, which is formed during the manufacturing process of the display device 10. Accordingly, the second insulating layer 520 may be formed to partially surround the outer surface of the light-emitting element 300. However, the disclosure is not limited thereto.

The contact electrodes 260 and the third insulating layer 530 may be disposed on the second insulating layer 520.

As shown in FIG. 2, the contact electrodes 260 may each have a shape extending in one direction. The contact electrodes 260 may contact the respective electrodes 210 and 220 and the light-emitting elements 300, and the light-emitting elements 300 may receive electrical signals from the first electrode 210 and the second electrode 220 through the contact electrodes 260.

The contact electrodes 260 may include a first contact electrode 261 and a second contact electrode 262. The first contact electrode 261 and the second contact electrode 262 may be disposed on the first electrode 210 and the second electrode 220, respectively. The first contact electrode 261 may be disposed on the first electrode 210, the second contact electrode 262 may be disposed on the second electrode 220, and the first contact electrode 261 and the second contact electrode 262 may each extend in the second direction DR2. The first contact electrode 261 and the second contact electrode 262 may be spaced apart from each other and face each other in the first direction DR1 and may form a stripe pattern in the light-emitting area EMA of each sub-pixel PXn.

In some embodiments, a width of each of the first contact electrode 261 and the second contact electrode 262, which is measured in a direction, may be greater than or equal to a width of each of the first electrode 210 and the second electrode 220, which is measured in the direction. The first contact electrode 261 and the second contact electrode 262 may be disposed to contact a first end portion and a second end portion of the light-emitting element 300, respectively, and to cover side surfaces of the first electrode 210 and the second electrode 220, respectively. As described above, the upper surface of each of the first electrode 210 and the second electrode 220 may be partially exposed, and the first contact electrode 261 and the second contact electrode 262 may contact the exposed upper surfaces of the first electrode 210 and the second electrode 220, respectively. For example, the first contact electrode 261 may contact a portion of the first electrode 210, which is located on the first inner bank 410, and the second contact electrode 262 may contact a portion of the second electrode 220, which is located on the second inner bank 420. However, the disclosure is not limited thereto, and in some embodiments, the widths of the first contact electrode 261 and the second contact electrode 262 may be formed to be less than those of the first electrode 210 and the second electrode 220, respectively, and the first contact electrode 261 and the second contact electrode 262 may be disposed to cover the exposed portions of the upper surfaces of the first electrode 210 and the second electrode 220, respectively. In addition, as shown in FIG. 3, at least a partial area of each of the first contact electrode 261 and the second contact electrode 262 is disposed on the first insulating layer 510.

According to an embodiment, the light-emitting element 300 has the semiconductor layer exposed on end surfaces thereof in an extending direction, and the first contact electrode 261 and the second contact electrode 262 may contact the light-emitting element 300 on the end surfaces where the semiconductor layer is exposed. However, the disclosure is not limited thereto. In some embodiments, end side surfaces of the light-emitting element 300 may be partially exposed. During the manufacturing process of the display device 10, the insulating layer 380 (see FIG. 4) surrounding an outer surface of the semiconductor layer of the light-emitting element 300 may be partially removed in a process of forming the second insulating layer 520 covering the outer surface of the light-emitting element 300, and the exposed side surface of the light-emitting element 300 may contact the first contact electrode 261 and the second contact electrode 262. A first end portion of the light-emitting element 300 may be electrically connected to the first electrode 210 through the first contact electrode 261, and a second end portion thereof may be electrically connected to the second electrode 220 through the second contact electrode 262.

FIG. 2 illustrates that a first contact electrode 261 and a second contact electrode 262 are disposed in a sub-pixel PXn, but the disclosure is not limited thereto. The numbers of the first contact electrodes 261 and second contact electrodes 262 may vary depending on the numbers of the first electrodes 210 and second electrodes 220 disposed in each sub-pixel PXn.

Further, as shown in FIG. 3, the first contact electrode 261 is disposed on the first electrode 210 and the second insulating layer 520. The first contact electrode 261 may contact a first end portion of the light-emitting element 300 and the exposed upper surface of the first electrode 210. The first end portion of the light-emitting element 300 may be electrically connected to the first electrode 210 through the first contact electrode 261.

The third insulating layer 530 is disposed on the first contact electrode 261. The third insulating layer 530 may electrically insulate the first contact electrode 261 and the second contact electrode 262 from each other. Specifically, the third insulating layer 530 may be disposed to cover the first contact electrode 261 and may not be disposed on the second end portion of the light-emitting element 300 so that the light-emitting element 300 may contact the second contact electrode 262. The third insulating layer 530 may partially contact the first contact electrode 261 and the second insulating layer 520 at an upper surface of the second insulating layer 520. A side surface of the third insulating layer 530 in a direction in which the second electrode 220 is disposed may be aligned with a side surface of the second insulating layer 520. In addition, the third insulating layer 530 may be disposed in a non-light-emitting area NEA, for example, on the first insulating layer 510 disposed on the first planarization layer 109. However, the disclosure is not limited thereto.

The second contact electrode 262 is disposed on the second electrode 220, the second insulating layer 520, and the third insulating layer 530. The second contact electrode 262 may contact the second end portion of the light-emitting element 300 and the exposed upper surface of the second electrode 220. The second end portion of the light-emitting element 300 may be electrically connected to the second electrode 220 through the second contact electrode 262.

For example, the first contact electrode 261 is disposed between the first electrode 210 and the third insulating layer 530, and the second contact electrode 262 may be disposed on the third insulating layer 530. The second contact electrode 262 may partially contact the second insulating layer 520, the third insulating layer 530, the second electrode 220, and the light-emitting element 300. A first end portion of the second contact electrode 262 in a direction in which the first electrode 210 is disposed may be disposed on the third insulating layer 530. The first contact electrode 261 and the second contact electrode 262 may not contact each other by the second insulating layer 520 and the third insulating layer 530. However, the disclosure is not limited thereto, and in some embodiments, the third insulating layer 530 may be omitted.

The contact electrode 260 may include a conductive material. For example, the contact electrode 260 may include ITO, IZO, ITZO, aluminum (Al), or the like. As an example, the contact electrode 260 may include a transparent conductive material, and light emitted from the light-emitting element 300 may pass through the contact electrode 260 and travel toward the electrodes 210 and 220. Each of the electrodes 210 and 220 may include a material having a high reflectance, and the electrodes 210 and 220 disposed on the inclined side surfaces of the inner banks 410 and 420 may reflect incident light in an upward direction with respect to the first substrate 101. However, the disclosure is not limited thereto.

The fourth insulating layer 550 may be disposed entirely on the first substrate 101. The fourth insulating layer 550 may serve to protect members, disposed on the first substrate 101, from an external environment.

Each of the first insulating layer 510, the second insulating layer 520, the third insulating layer 530, and the fourth insulating layer 550, which are described above, may include an inorganic insulating material or an organic insulating material. In an embodiment, the first insulating layer 510, the second insulating layer 520, the third insulating layer 530, and the fourth insulating layer 550 may each include an inorganic insulating material such as silicon oxide ($SiO_x$), silicon nitride ($SiN_x$), silicon oxynitride ($SiO_xN_y$), aluminum oxide ($Al_2O_3$), aluminum nitride (AlN), or the like. As another example, the first insulating layer 510, the second insulating layer 520, the third insulating layer 530, and the fourth insulating layer 550 may each include an organic insulating material such as an acrylic resin, an epoxy resin, a phenol resin, a polyamide resin, a PI resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the disclosure is not limited thereto.

The light-emitting element 300 may be a light-emitting diode, and specifically, may be an inorganic light-emitting diode having a size of a micrometer unit or a nanometer unit and made of (or include) an inorganic material. The inorganic light-emitting diode may be aligned between two electrodes in which polarity is formed by forming an electric field in a specific direction between the two electrodes facing each other. The light-emitting element 300 may be aligned between two electrodes by the electric field formed on the two electrodes.

The light-emitting element 300 according to an embodiment may have a shape extending in one direction. The light-emitting element 300 may have a shape of a rod, a wire, a tube, or the like. In an embodiment, the light-emitting element 300 may have a cylindrical shape or a rod shape. However, the shape of the light-emitting element 300 is not limited thereto, and the light-emitting element 300 may have a shape of a cube, a rectangular parallelepiped, a polygonal pillar such as a hexagonal pillar or the like or have a shape which extends in a direction and has a partially inclined outer surface. Thus, the light-emitting element 300 may have various shapes. Semiconductors included in the light-emitting element 300, which will be described below, may have a structure in which the semiconductors are sequentially disposed or stacked in the direction.

The light-emitting element 300 may include a semiconductor core and an insulating layer surrounding the semiconductor core. The semiconductor core of the light-emitting element 300 may include a semiconductor layer doped with an arbitrary conductive-type (for example, p-type or n-type) impurity. The semiconductor layer may receive an electrical signal applied from an external power source and emit light in a specific wavelength range.

Figure 4:
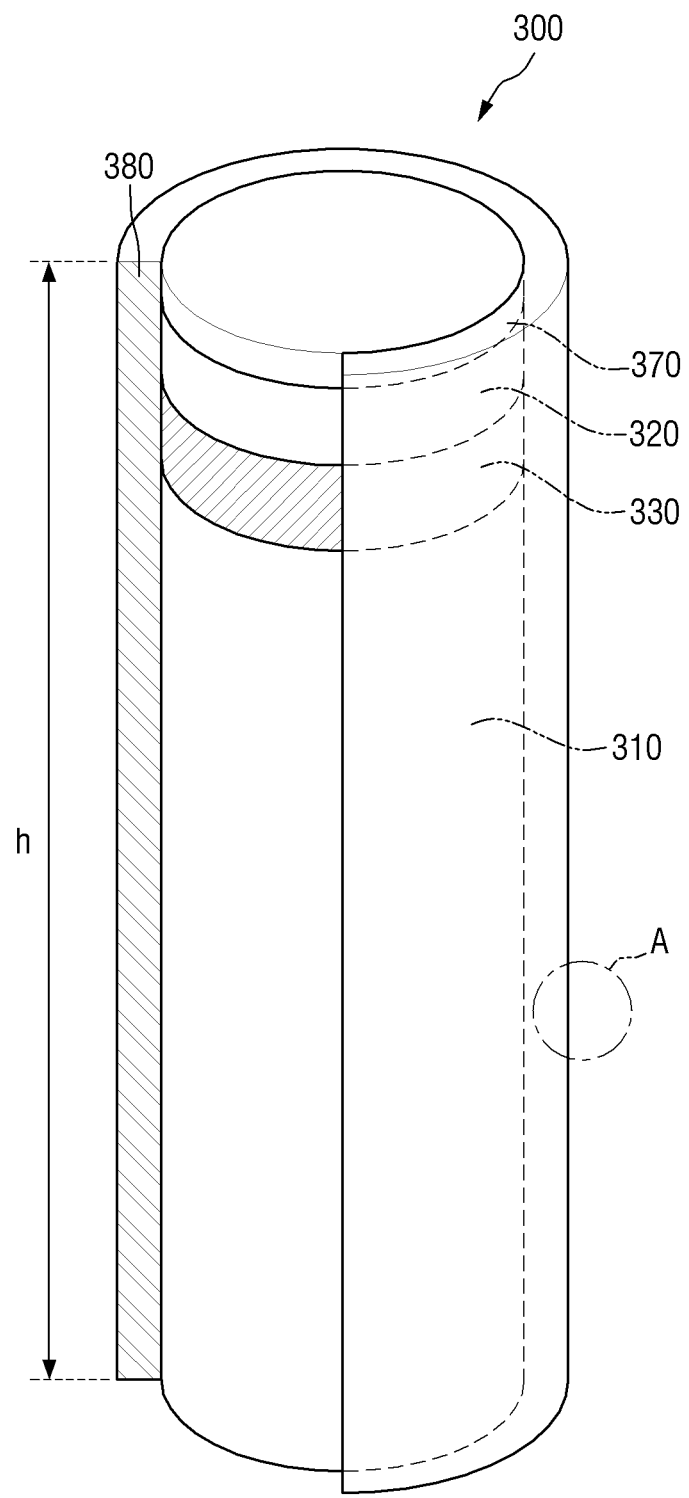
FIG. 4 is a schematic view of a light-emitting element according to an embodiment.

FIG. 4 is a schematic view of the light-emitting element according to an embodiment.

Referring to FIG. 4, the light-emitting element 300 may include a first semiconductor layer 310, a second semiconductor layer 320, an active layer 330, an electrode layer 370, and an insulating layer 380. The light-emitting element 300 may include the semiconductor core including the first semiconductor layer 310, the second semiconductor layer 320, and the active layer 330, and the insulating layer 380 surrounding an outer surface of the semiconductor core.

The first semiconductor layer 310 may be a semiconductor doped with a first polarity dopant and may be an n-type semiconductor. As an example, in case that the light-emitting element 300 emits light in a blue wavelength range, the first semiconductor layer 310 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more among AlGaInN, GaN, AlGaN, InGaN, AlN, and InN that are doped with an n-type impurity. The first semiconductor layer 310 may be doped with an n-type dopant. As an example, the n-type dopant may be Si, Ge, Sn, or the like. In an embodiment, the first semiconductor layer 310 may be n-GaN doped with n-type Si. A length of the first semiconductor layer 310 may range from about 1.5 μm to about 5 μm, but the disclosure is not limited thereto.

The second semiconductor layer 320 is disposed on the active layer 330 to be described below. For example, the second semiconductor layer 320 may be a semiconductor doped with a second polarity dopant different from the first polarity dopant and may be a p-type semiconductor. As an example, in case that the light-emitting element 300 emits light in a blue or green wavelength range, the second semiconductor layer 320 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more among AlGaInN, GaN, AlGaN, InGaN, AlN, and InN that are doped with a p-type impurity. The second semiconductor layer 320 may be doped with a p-type dopant. As an example, the p-type dopant may be Mg, Zn, Ca, Se, Ba, or the like. In an embodiment, the second semiconductor layer 320 may be p-GaN doped with p-type Mg. A length of the second semiconductor layer 320 may range from about 0.05 μm to about 0.10 μm, but the disclosure is not limited thereto.

FIG. 4 illustrates that each of the first semiconductor layer 310 and the second semiconductor layer 320 is formed as a layer, but the disclosure is not limited thereto. According to some embodiments, each of the first semiconductor layer 310 and the second semiconductor layer 320 may further include a larger number of layers, e.g., a clad layer or a tensile strain barrier reducing (TSBR) layer according to a material of the active layer 330. A description thereof will be provided below with reference to other drawings.

The active layer 330 is disposed between the first semiconductor layer 310 and the second semiconductor layer 320. The active layer 330 may include a material having a single or multiple quantum well structure. In case that the active layer 330 includes a material having a multiple quantum well structure, the active layer 330 may have a structure in which quantum layers and well layers are alternately stacked. The active layer 330 may emit light by a combination of electron-hole pairs in response to electrical signals applied thereto through the first semiconductor layer 310 and the second semiconductor layer 320. As an example, in case that the active layer 330 emits light in a blue wavelength range, the active layer 330 may include a material such as AlGaN, AlGaInN, or the like. In particular, in case that the active layer 330 has a multiple quantum well structure in which quantum layers and well layers are alternately stacked, the quantum layer may include a material such as AlGaN or AlGaInN, and the well layer may include a material such as GaN or AlInN. In an embodiment, the active layer 330 includes AlGaInN as a quantum layer and AlInN as a well layer. As described above, the active layer 330 may emit blue light having a central wavelength band ranging from about 450 nm to about 495 nm.

However, the disclosure is not limited thereto, and the active layer 330 may have a structure in which a semiconductor material having large bandgap energy and a semiconductor material having small bandgap energy are alternately stacked or include other group III to group V semiconductor materials according to the wavelength range of emitted light. The light emitted by the active layer 330 is not limited to light in a blue wavelength range, and the active layer 330 may also emit light in a red or green wavelength range in some embodiments. A length of the active layer 330 may range from about 0.05 µm to about 0.10 µm, but the disclosure is not limited thereto.

The light emitted from the active layer 330 may be emitted to not only an outer surface of the light-emitting element 300 in a length direction but also the side surfaces of the light-emitting element 300. Directivity of the light emitted from the active layer 330 is not limited to one direction.

The electrode layer 370 may be an ohmic contact electrode. However, the disclosure is not limited thereto, and the electrode layer 370 may also be a Schottky contact electrode. The light-emitting element 300 may include at least one electrode layer 370. Although FIG. 4 illustrates that the light-emitting element 300 includes a single electrode layer 370, the disclosure is not limited thereto. In some embodiments, the light-emitting element 300 may include a larger number of electrode layers 370, or the electrode layer 370 may be omitted. The description of the light-emitting element 300, which will be provided below, may be identically applied even in case that the number of the electrode layers 370 is varied or another structure is further included.

In case that the light-emitting element 300 is electrically connected to the electrodes 210 and 220 or the contact electrode 260, the electrode layer 370 may reduce resistance between the light-emitting element 300 and the electrode or contact electrode. The electrode layer 370 may include a conductive metal. For example, the electrode layer 370 may include at least one among aluminum (Al), titanium (Ti), indium (In), gold (Au), silver (Ag), indium tin oxide (ITO), indium zinc oxide (IZO), and indium tin-zinc oxide (ITZO). Further, the electrode layer 370 may include a semiconductor material doped with an n-type or p-type impurity. The electrode layer 370 may include a same material or different materials, but the disclosure is not limited thereto.

The insulating layer 380 is disposed to surround outer surfaces of the semiconductor layers and the electrode layers, which are described above. In an embodiment, the insulating layer 380 may be disposed to surround at least an outer surface of the active layer 330 and may extend in a direction in which the light-emitting element 300 extends. The insulating layer 380 may serve to protect the members. As an example, the insulating layer 380 may be formed to surround side surfaces of the members and expose end portions of the light-emitting element 300 in the length direction.

FIG. 4 illustrates that the insulating layer 380 is formed to extend in the length direction of the light-emitting element 300 to cover from the first semiconductor layer 310 to a side surface of the electrode layer 370, but the disclosure is not limited thereto. Since the insulating layer 380 covers only the outer surfaces of some semiconductor layers including the active layer 330 or covers only a portion of the outer surface of the electrode layer 370, the outer surface of the electrode layer 370 may be partially exposed. In addition, an upper surface of the insulating layer 380 may be formed to be rounded in an area thereof adjacent to at least one first portion of the light-emitting element 300, in a cross-sectional view.

A thickness of the insulating layer 380 may range from about 10 nm to about 1.0 µm, but the disclosure is not limited thereto. The thickness of the insulating layer 380 may be about 40 nm.

The light-emitting element 300 may have a length h ranging from about 1 µm to about 10 µm or from about 2 µm to about 6 µm, or from about 3 am to about 5 µm. In addition, a diameter of the light-emitting element 300 may range from about 300 nm to about 700 nm, and an aspect ratio of the light-emitting element 300 may range from about 1.2 to 100. However, the disclosure is not limited thereto, and the light-emitting elements 300 included in the display device 10 may have different diameters according to a composition difference of the active layer 330. The diameter of the light-emitting element 300 may have a range of about 500 nm.

As described above, in the light-emitting element 300 according to an embodiment, the insulating layer 380 may include the insulating film 381 and the element dispersion agent 385. The element dispersion agent 385 may be bonded to an outer surface of the insulating film 381 and may include a magnetic metal. The light-emitting elements 300 may each include the element dispersion agent 385 including a magnetic metal to receive a magnetic force directed toward a specific direction and maintain a dispersed state in the ink for a long period of time.

Specifically, the insulating film 381 may be formed to surround outer surfaces of the semiconductor layers of the light-emitting element 300. For example, the insulating film 381 may be formed to surround at least the outer surface of the active layer 330, and may extend in a direction in which the light-emitting element 300 extends, for example, a direction in which the first semiconductor layer 310, the active layer 330, and the second semiconductor layer 320 are stacked. As described above, the insulating film 381 may be formed to surround the active layer 330 and the outer surfaces of the first semiconductor layer 310, the second semiconductor layer 320, and the electrode layer 370.

The insulating film 381 may include at least one selected from among materials having insulating properties, for example, silicon oxide ($SiO_x$), silicon nitride ($SiN_x$), silicon oxynitride ($SiO_xN_y$), aluminum nitride (AlN), aluminum oxide ($Al_2O_3$), or the like. Accordingly, it is possible to prevent an electrical short circuit which may occur in case that the active layer 330 directly contacts the electrode through which an electrical signal is transmitted to the light-emitting element 300. Further, since the insulating film 381 protects the outer surface of the light-emitting element 300 including the active layer 330, it is possible to prevent degradation in light-emitting efficiency.

The element dispersion agent 385 may include a magnetic metal. According to an embodiment, the element dispersion agent 385 may include a ligand 385p forming a coordination bond with the magnetic metal, and a first functional group 385a bonded to the ligand 385p to form a chemical bond with the insulating film 381. In addition, the element dispersion agent 385 may include a second functional group 385b ("Y" in FIG. 5) bonded to the ligand 385p and different from the first functional group 385a.

Figure 5:
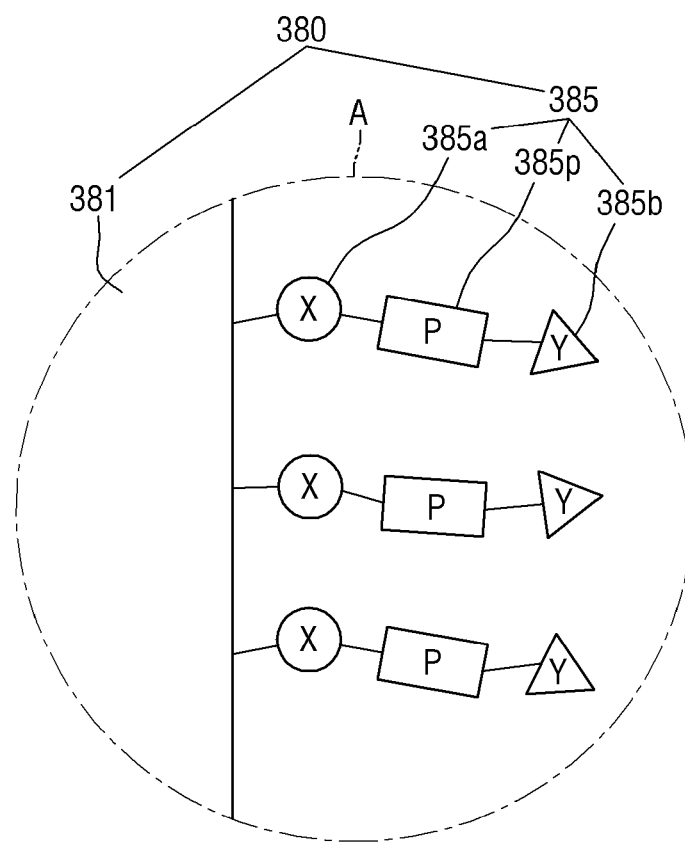
FIG. 5 is a schematic enlarged schematic view of portion A of FIG. 4.

FIG. 5 is a schematic enlarged view of portion A of FIG. 4. FIG. 5 schematically illustrates the insulating film 381 and the element dispersion agent 385 by enlarging an outer surface of the insulating layer 380 of FIG. 4.

Referring to FIG. 5 in conjunction with FIG. 4, the ligand 385p ("P" in FIG. 5) of the element dispersion agent 385 may form a coordination bond with the magnetic metal (not shown). The magnetic metal may form a coordination bond with the ligand 385p. As will be described below, in case that a magnetic field is applied to the light-emitting element 300, a magnetic force may be applied to the magnetic metal in a direction due to the magnetic field. The light-emitting elements 300 may receive the magnetic force that the magnetic metal receives, and may maintain a dispersed state for a long period of time because a precipitation rate of the light-emitting element in the ink is reduced. In some embodiments, during the manufacturing process of the display device 10, the light-emitting elements 300 may be uniformly dispersed in a state in which the magnetic field is applied, and sprayed by an inkjet printing process.

The types of the ligand 385p and the magnetic metal are not particularly limited. For example, the ligand 385p is not particularly limited as long as it has a structure capable of fixing a magnetic metal by forming a coordination bond with the magnetic metal as a central metal. In an embodiment, the ligand 385p may be a porphyrin structure, a multi-dentate structure, or the like, and the magnetic metal may be Fe, Mn, Co, Ni, Cr, or the like, but the disclosure is not limited thereto.

The first functional group 385a ("X" in FIG. 5) of the element dispersion agent 385 may be bonded to the ligand 385p to form a chemical bond with an outer surface of the insulating film 381. For example, the first functional group 385a may form a covalent bond with the material forming the insulating film 381, and the ligand 385p forming a coordination bond with the magnetic metal may be bonded to the insulating film 381 through the first functional group 385a.

The first functional group 385a may include a bonding portion that forms a chemical bond with the insulating film 381, and a connection portion that is connected to the bonding portion to be bonded to the ligand 385p. In an embodiment, the insulating film 381 may include a material such as aluminum oxide ($Al_2O_3$) or silicon oxide ($SiO_x$) as described above, and the bonding portion of the first functional group 385a may be one of functional groups such as a silane group, a boronate group, a carboxylic acid group, an amine group, a thiol group, and a phosphoric acid group. However, the disclosure is not limited thereto.

Further, the first functional group 385a may include an alkenyl group, an alkynyl group, or the like having about 1 to about 6 carbon atoms as the connection portion. For example, the first functional group 385a may include a carbon chain having a single bond. The carbon chain having a single bond may be capable of single bond rotation, and the ligand 385p and the magnetic metal bonded to the insulating film 381 through the first functional group 385a may be oriented in random directions. However, in case that a magnetic field is formed in the ink in which the light-emitting elements 300 are dispersed, a magnetic force due to the magnetic field may be applied to the magnetic metal in a direction, the connection portion of the first functional group 385a is rotated, and the element dispersion agent 385 may be oriented in a same direction.

The element dispersion agent 385 may further include at least one second functional group 385b bonded to the ligand 385p. The second functional group 385b may be a functional group different from the first functional group 385a. As described above, the light-emitting elements 300 may be prepared in a state of being dispersed in the ink, and the outer surface of each of the light-emitting elements 300 may be surface-treated so that the light-emitting elements 300 do not aggregate with other light-emitting elements 300. According to an embodiment, in the insulating layer 380 of the light-emitting element 300, the element dispersion agent 385 may further include the second functional group 385b including a hydrophobic functional group, and the light-emitting elements 300 may be dispersed in the ink without being aggregated with each other. In some embodiments, the second functional group 385b may be an alkyl group having about 1 to about 6 carbon atoms, a fluoroalkyl group having about 1 to about 6 carbon atoms, or a cycloalkyl group having about 3 to about 6 carbon atoms, and or the like, but the disclosure is not limited thereto.

In an embodiment, the element dispersion agent 385 of the light-emitting element 300 may have a structure represented by any of Chemical Formulas A to D below.

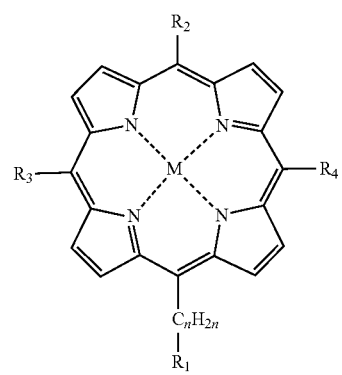

[Chemical Formula A]

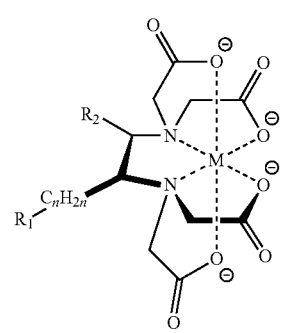

[Chemical Formula B]

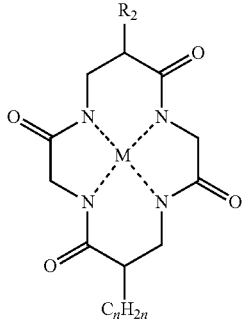

[Chemical Formula C]

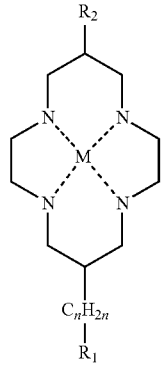

[Chemical Formula D]

In Chemical Formulas A to D, M is at least one of $Fe^{2+}$, $Mn^{2+}$, $Co^{2+}$, $Ni^{2+}$, and $Cr^{2+}$, $R_1$ is at least one of a silane group, a boronate group, a carboxylic acid group, an amine group, a thiol group, and a phosphoric acid group, $R_2$ to $R_4$ are each independently one of hydrogen, an alkyl group having about 1 to about 6 carbon atoms, a fluoroalkyl group having about 1 to about 6 carbon atoms, and a cycloalkyl group having about 3 to about 6 carbon atoms, n is an integer of 1 to 6, and a dash line indicates a coordination bond.

The element dispersion agent 385 may have a structure represented by one of Chemical Formulas A to D described above. In Chemical Formulas A to D, M may be the magnetic metal, $R_1$ may be the bonding portion of the first functional group 385a, and $R_2$ to $R_4$ may be the second functional group 385b.

As described above, the element dispersion agent 385 may include the ligand 385p that forms a coordination bond with the magnetic metal as a central metal. As an example, the ligand 385p of the element dispersion agent 385 may be a porphyrin structure or a multi-dentate structure. Chemical Formula A is a case in which the ligand 385p is a porphyrin structure, and at least some of the four nitrogen atoms (N) of the porphyrin structure may form a coordination bond with the magnetic metal (M). In addition, Chemical Formulas B to D are cases in which the ligand 385p is a multi-dentate structure, and at least some of oxygen atoms (O) or nitrogen atoms (N) of the dentate structure may form a coordination bond with the magnetic metal. The magnetic metal may form a coordination bond with the ligand 385p in the form of an ion with a charge.

Further, the first functional group 385a may include $R_1$ corresponding to the bonding portion and $-C_nH_{2n}-$ corresponding to the connection portion. $R_1$ may form a chemical bond, e.g., a covalent bond, with the insulating film 381 of the insulating layer 380, and a carbon chain ($-C_nH_{2n}-$) corresponding to the connection portion may be bonded to the porphyrin structure or the dentate structure. $R_2$ to $R_4$ corresponding to the second functional group 385b may include a hydrophobic functional group as described above. However, in case that $R_2$ to $R_4$ are each independently hydrogen, the element dispersion agent 385 may be a structure that does not include the second functional group 385b.

The magnetic metal (M) may be fixed to the ligand 385p by forming a coordination bond therewith. In case that the light-emitting element 300 including the element dispersion agent 385 is placed in a magnetic field directed in a direction, the magnetic metal (M) may receive a magnetic force according to the direction of the magnetic field. For example, the light-emitting element 300 may receive a magnetic force directed in a direction opposite to a gravity direction according to the direction of the magnetic field, and a precipitation rate of the light-emitting element 300 in the ink in which the magnetic field is formed may be reduced.

Figure 6:
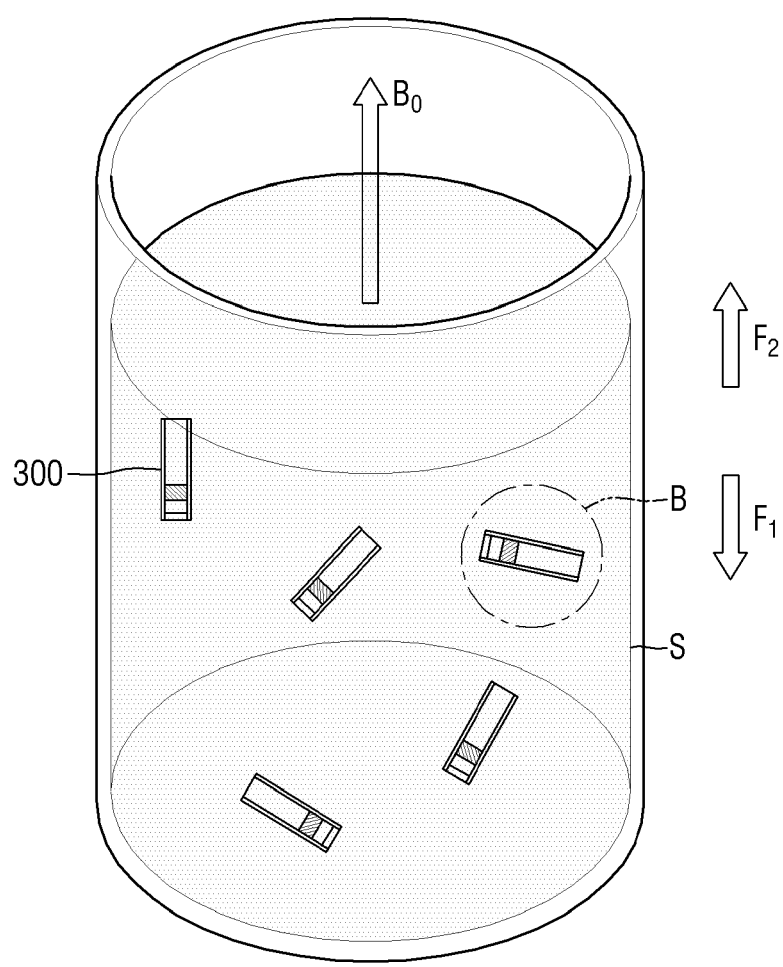
FIG. 6 is a schematic view illustrating a case in which a magnetic field is applied to light-emitting elements according to an embodiment.
Figure 7:
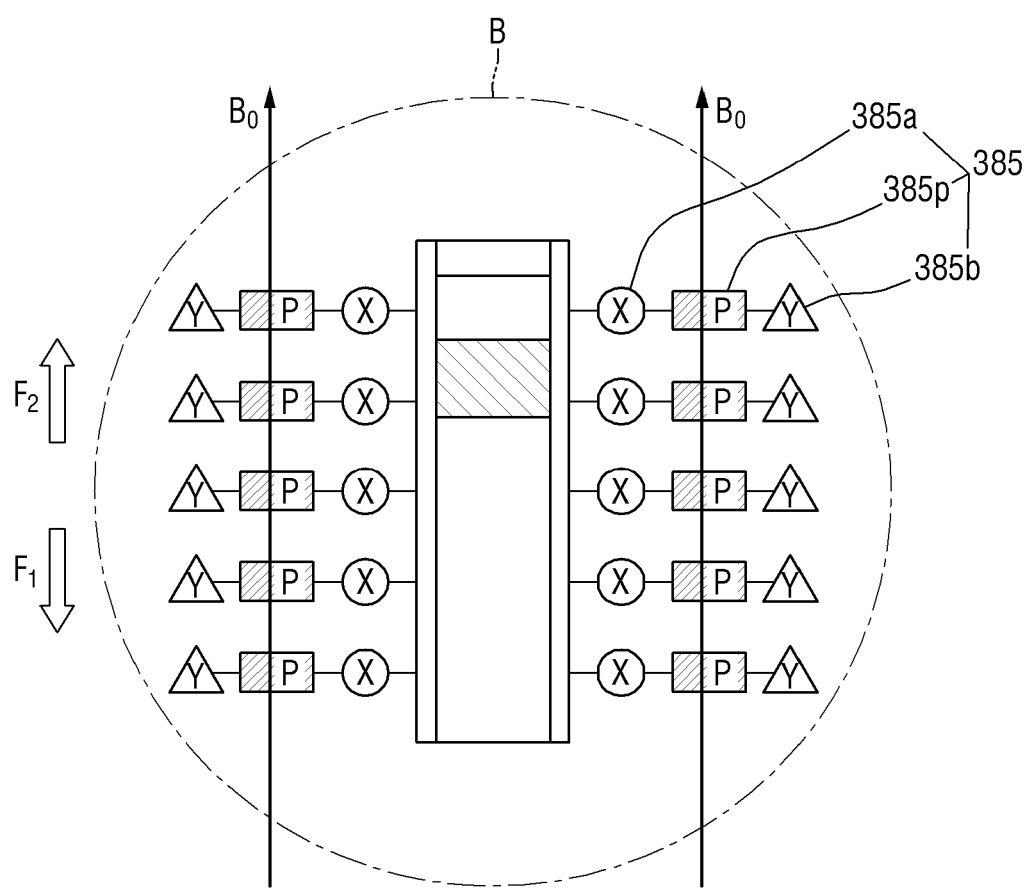
FIG. 7 is an enlarged schematic view of portion B of FIG. 6

FIG. 6 is a schematic view illustrating a case in which a magnetic field is applied to the light-emitting elements according to an embodiment. FIG. 7 is a schematic enlarged view of portion B of FIG. 6.

Describing in detail with reference to FIGS. 6 and 7, the light-emitting elements 300 according to an embodiment each include the insulating layer 380 including the element dispersion agent 385, and thus may be prepared in a state of being dispersed in an ink S in the manufacturing process of the display device 10.

The ink S may be an organic solvent capable of storing the light-emitting elements 300 in a dispersed state without reacting with the light-emitting elements 300. In addition, the ink S may be a material that is vaporized or volatilized by heat. As will be described below, after aligning the light-emitting elements 300 between the electrodes 210 and 220 during the manufacturing process of the display device 10, the ink S may be volatilized and removed by a heat treatment process. In other words, the ink S may have a viscosity sufficient to smoothly disperse the light-emitting elements 300, and may have a boiling point or viscosity that may be readily volatilized by heat. For example, the ink S may be propylene glycol monomethylether (PGME), propylene glycol monomethylether acetate (PGMEA), propylene glycol (PG), acetone, alcohol, toluene, or the like. However, the disclosure is not limited thereto.

As described above, the light-emitting element 300 includes the semiconductor layer having a high specific gravity, or a semiconductor core. As shown in FIG. 7, the light-emitting elements 300 dispersed in the ink S may receive gravity $F_1$ and may be precipitated into a lower surface of a container in which the ink S is prepared. In case that the light-emitting element 300 is precipitated in the ink S, the number of the light-emitting elements 300 included in the ink S may be non-uniform in the process of spraying the ink S during the manufacturing process of the display device 10.

However, the light-emitting element 300 according to an embodiment may include the element dispersion agent 385 including a magnetic metal (M), and may receive a magnetic force directed in a direction when placed in a magnetic field directed in the direction. As shown in FIG. 7, in case that a magnetic field $B_0$ is formed in the ink S in a direction opposite to the gravity direction, a magnetic force may be applied to the magnetic metal included in the element dispersion agent 385 of the light-emitting element 300 in a direction parallel to the direction of the magnetic field $B_0$. As in Chemical Formulas A to D, the magnetic metal may form a coordination bond with the ligand 385p in the form of an ion with a charge. A magnetic force that is an attractive or repulsive force depending on the direction of the magnetic field $B_0$ may be applied to the magnetic metal with a charge.

The magnetic force $F_2$ (see FIG. 6) applied to the magnetic metal of the element dispersion agent 385 may be transmitted to the light-emitting element 300, and in some embodiments, a direction in which the magnetic field $B_0$ is formed may be a direction opposite to the gravity direction. For example, the light-emitting element 300 may receive a magnetic force $F_2$ directed in a direction opposite to the gravity direction according to the direction of the magnetic field $B_0$. Accordingly, the light-emitting elements 300 according to an embodiment may maintain a dispersed state for a long period of time because a precipitation rate of the light-emitting element 300 is reduced in the ink S, and the light-emitting elements 300 may be sprayed in a state of being uniformly dispersed by an inkjet printing process during the manufacturing process of the display device 10.

Although not shown in the drawing, a method of applying the magnetic field $B_0$ to the light-emitting element 300 is not particularly limited. For example, the magnetic field $B_0$ may be formed by a coil surrounding a container in which the ink S in which the light-emitting elements 300 are dispersed is prepared, and in some embodiments, a magnetic field $B_0$ may be applied from a device prepared outside the container.

Hereinafter, a method of manufacturing the display device 10 according to an embodiment will be described with reference to other drawings.

Figure 8:
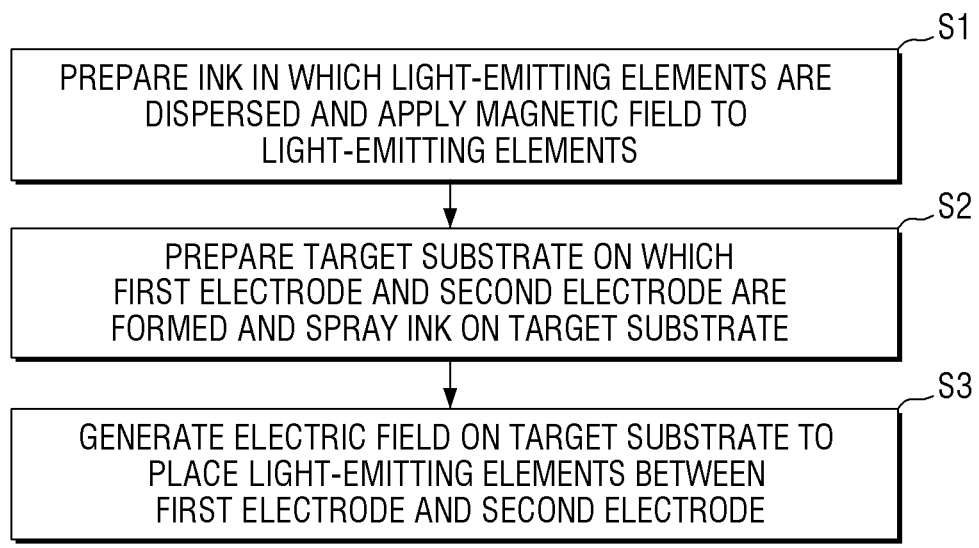
FIG. 8 is a schematic flowchart illustrating a method of manufacturing the display device according to an embodiment.

FIG. 8 is a flowchart illustrating a method of manufacturing the display device according to an embodiment.

Referring to FIG. 8, the method of manufacturing the display device 10 according to an embodiment may include preparing an ink S in which light-emitting elements 300 are dispersed, and applying a magnetic field to the light-emitting elements 300 (S1), preparing a target substrate SUB on which a first electrode 210 and a second electrode 220 disposed to be spaced apart from each other are formed, and spraying the ink S on the target substrate SUB (S2), and generating an electric field on the target substrate SUB to place the light-emitting element 300 between the first electrode 210 and the second electrode 220 (S3).

The magnetic field may be applied to the light-emitting elements 300 prepared in a state of being dispersed in the ink S. As described above, in case that the magnetic field is applied, a magnetic force that the magnetic metal included in the element dispersion agent 385 receives may be transmitted to the light-emitting element 300 so that a precipitation rate of the light-emitting element 300 may be reduced. The light-emitting elements 300 may maintain a uniformly dispersed state before being sprayed onto the target substrate SUB, on which is disposed between the first electrode 210 and the second electrode 220, by an inkjet printing process. Hereinafter, the manufacturing process of the display device 10 will be described in detail with further reference to other drawings.

First, as described above with reference to FIGS. 6 and 7, an ink S in which light-emitting elements 300 each including a semiconductor core and an insulating layer 380 are dispersed is prepared, and a magnetic field is applied to the light-emitting elements 300 (S1). A magnetic force may be applied to a magnetic metal in an element dispersion agent 385 of the light-emitting element 300 by the magnetic field, and the magnetic force may be transmitted to the light-emitting element 300. According to an embodiment, during the manufacturing process of the display device 10, the magnetic force may be applied to the light-emitting element 300 in a direction opposite to a gravity direction in the applying of the magnetic field (S1).

As will be described below, in the process of spraying the ink S in which the light-emitting elements 300 are dispersed, a magnetic field is applied to the light-emitting elements 300 in a direction so that the light-emitting elements 300 may maintain a uniformly dispersed state in the ink S. The magnetic field may be applied such that the magnetic force transmitted to the light-emitting element 300 is directed toward the direction opposite to the gravity direction. As shown in FIG. 6, a magnetic force $F_2$ may be transmitted to the light-emitting element 300 in the direction opposite to the gravity $F_1$, and a precipitation rate of the light-emitting element 300 may be reduced in the ink S.

Figure 9:
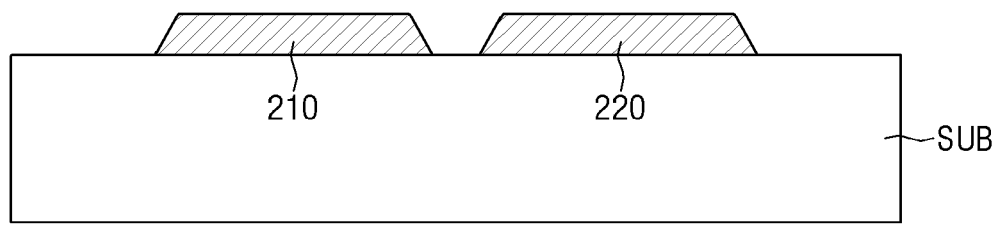
FIG. 9 is a schematic cross-sectional view illustrating one operation of a manufacturing process of the display device according to an embodiment.

FIG. 9 is a schematic cross-sectional view illustrating an operation of the manufacturing process of the display device according to an embodiment.

Referring to FIG. 9, a target substrate SUB on which a first electrode 210 and a second electrode 220 are disposed is prepared. Although FIG. 9 illustrates only the target substrate SUB, the first electrode 210, and the second electrode 220 for convenience of description, conductive layers and insulating layers disposed below the first electrode 210 and the second electrode 220 may be further disposed in the display device 10 as described above. For example, the target substrate SUB of FIG. 9 may be understood as including the first substrate 101 of FIG. 3 and including conductive layers and insulating layer disposed on the first substrate 101. Since descriptions thereof are the same as described above, detailed descriptions thereof will be omitted.

Figure 10:
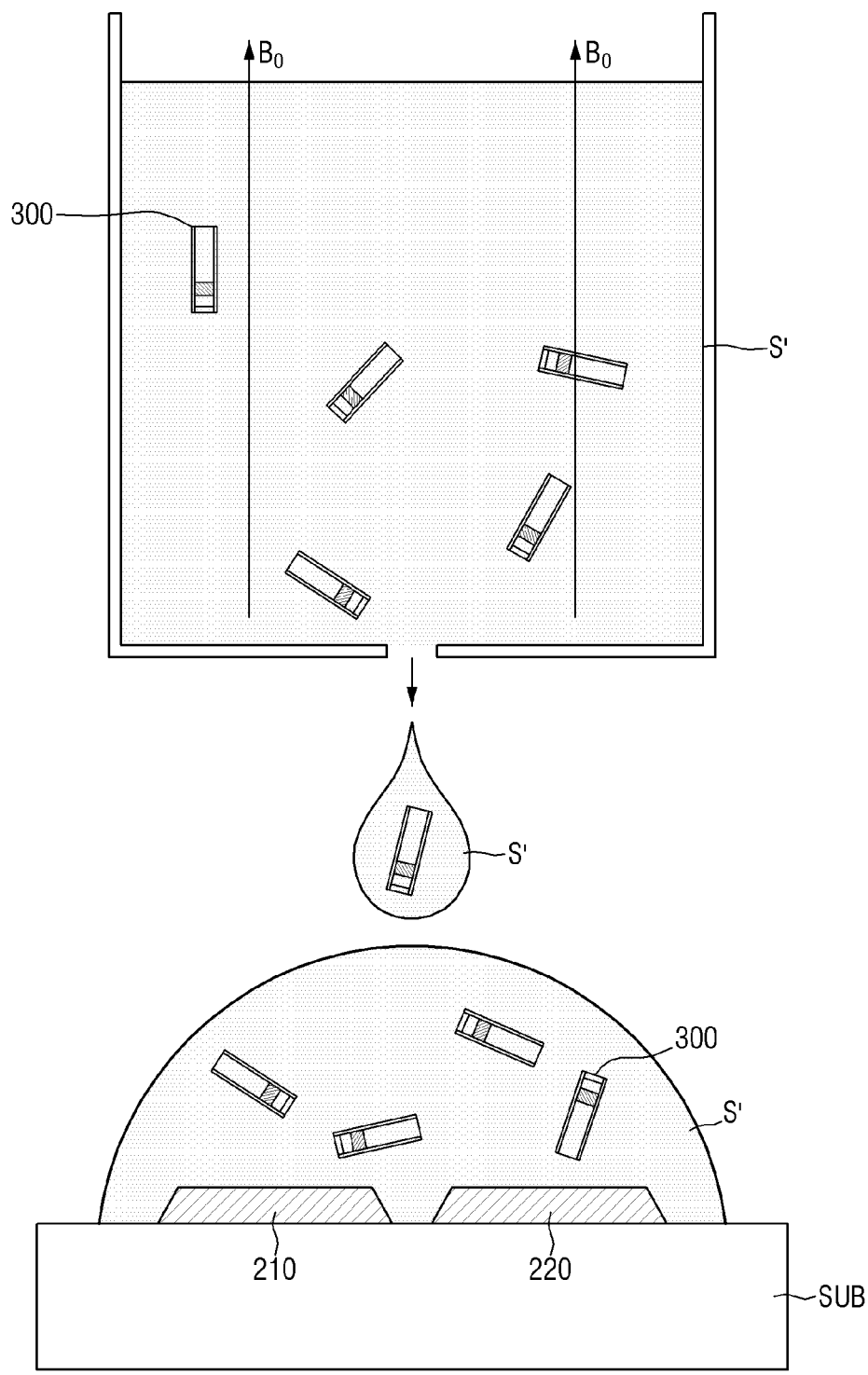
FIGS. 10 and 11 are schematic cross-sectional views illustrating one operation of the manufacturing process of the display device according to an embodiment.
Figure 11:
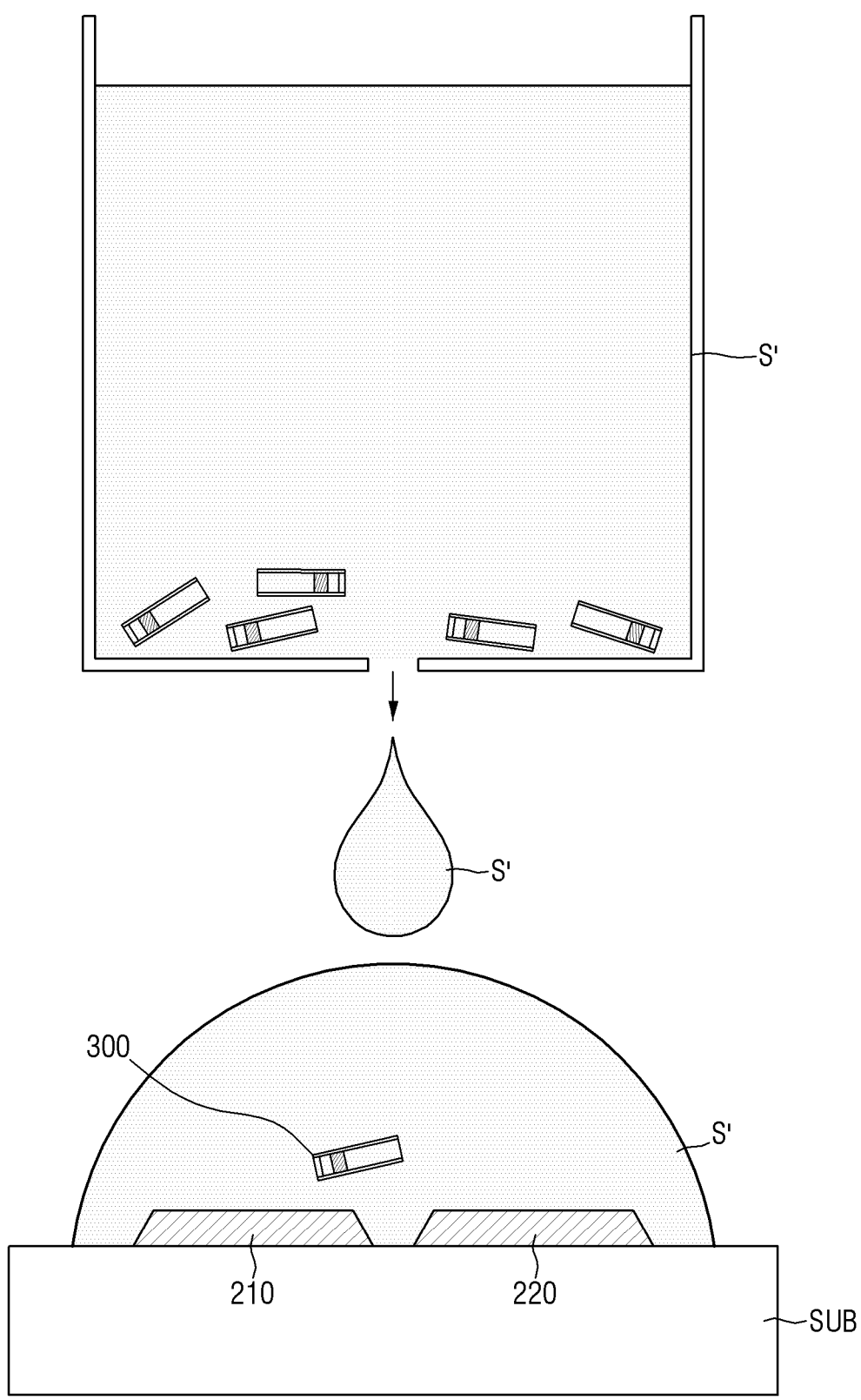

FIGS. 10 and 11 are schematic cross-sectional views illustrating an operation of the manufacturing process of the display device according to an embodiment.

Subsequently, referring to FIG. 10, the ink S in which the light-emitting elements 300 are dispersed is sprayed onto the first substrate 101 (S2). In an embodiment, the ink S may be sprayed onto the first substrate 101 by a printing process using an inkjet printing device (not shown). The ink S in which the light-emitting elements 300 are dispersed may be prepared in the inkjet printing device, and, as described above, the magnetic field directed in a direction may be formed in the ink S.

According to an embodiment, the ink S may be sprayed onto the first substrate 101 in a state in which a magnetic field $B_0$ is applied. As described above, the display device 10 includes pixels PX and sub-pixels PXn, and the ink S in which the light-emitting elements 300 are dispersed may be sprayed in each sub-pixel PXn in the inkjet printing process. The inkjet printing process may be performed in a state in which a magnetic field is applied to the light-emitting elements 300, so that the light-emitting elements 300 may maintain a uniformly dispersed state during the process of spraying the ink S. Accordingly, a uniform number of light-emitting elements 300 may be dispersed in the ink S sprayed in each pixel PX or sub-pixel PXn.

Figure 12:
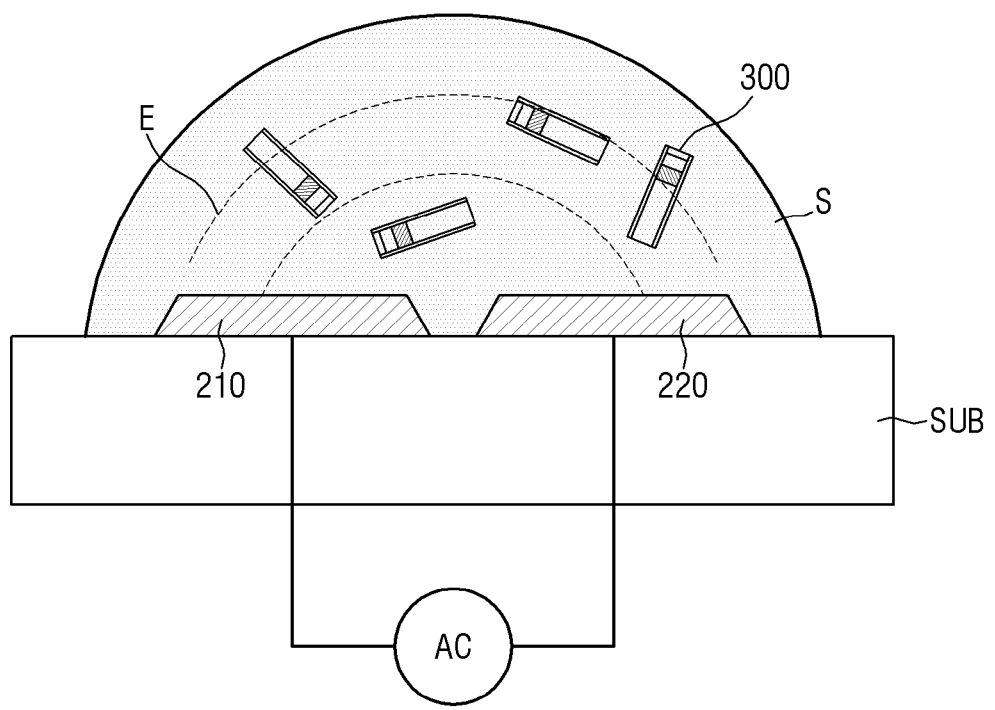
FIG. 12 is a schematic cross-sectional view illustrating one operation of the manufacturing process of the display device according to an embodiment.

Referring to FIG. 12, in case that an ink S' is sprayed in a state in which the magnetic field is not applied to the light-emitting elements 300, some of the light-emitting elements 300 may be precipitated on a lower surface of a container in which the ink S' is prepared. In this case, in the inkjet printing process, a smaller number of light-emitting elements 300 may be included in the ink S' sprayed onto some sub-pixels PXn than in the ink S' sprayed onto the other sub-pixels PXn.

The method of manufacturing the display device 10 according to an embodiment may perform spraying the ink S in a state in which a magnetic field is applied to the light-emitting elements 300, and the ink S sprayed in each sub-pixel PXn may include a uniform number of light-emitting elements 300. Accordingly, in the display device 10, a uniform number of light-emitting elements 300 may be disposed in each of the pixels PX or sub-pixels PXn.

Figure 13:
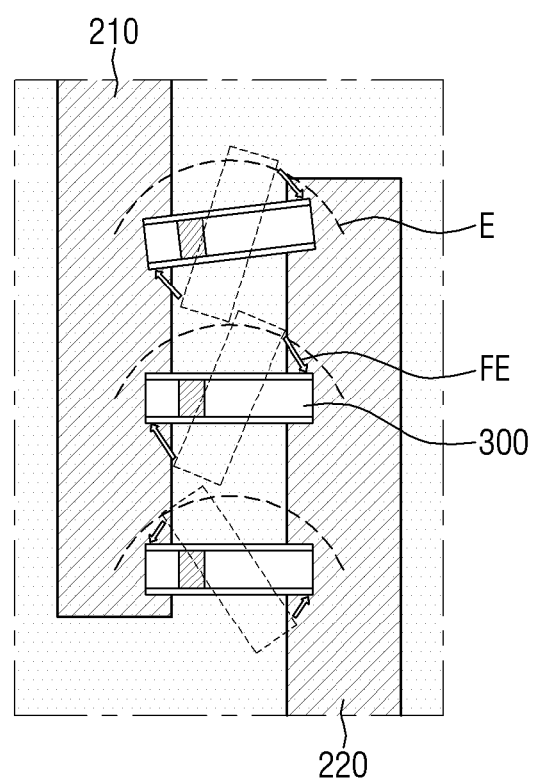
FIG. 13 is a schematic view illustrating a case in which light-emitting elements in the operation of FIG. 12 are aligned.

FIG. 12 is a schematic cross-sectional view illustrating an operation of the manufacturing process of the display device according to an embodiment. FIG. 13 is a schematic view illustrating a case in which the light-emitting elements in the operation of FIG. 12 are aligned.

Referring to FIGS. 12 and 13, an electric field is generated on the target substrate SUB to dispose (or place) the light-emitting elements 300 between the first electrode 210 and the second electrode 220 (S3). In case that an alignment signal is applied to the first electrode 210 and the second electrode 220, an electric field E may be generated on the target substrate SUB. In an embodiment, the alignment signal may be an alternating current (AC) voltage, and the AC voltage may have a voltage of about ±10 to about ±50 V and a frequency of about 10 kHz to about 1 MHz.

In case that the AC voltage is applied to the first electrode 210 and the second electrode 220, the electric field E is generated therebetween, and the electric field E may be applied to the light-emitting elements 300 dispersed in the ink S. The light-emitting elements 300 to which the electric field E is applied may receive a dielectrophoretic force FE (see FIG. 13) in the ink S, and the light-emitting elements 300 receiving the dielectrophoretic force FE may be placed between the first electrode 210 and the second electrode 220 while the orientation direction and position of each of the light-emitting elements 300 are changed.

According to an embodiment, in the disposing of the light-emitting element 300, the electric field E may cause a first end portion of each of the light-emitting elements 300 to be disposed on the first electrode 210, and a second end portion thereof to be disposed on the second electrode 220. As shown in FIG. 13, end portions of each of the light-emitting elements 300 may move from initial sprayed positions (a dotted line portion of FIG. 13) toward the electrodes 210 and 220, respectively, and each of the light-emitting elements 300 may be oriented such that an extending direction thereof is directed in a direction. Although end portions of each of the light-emitting elements 300 may be disposed on the electrodes 210 and 220, respectively, the disclosure is not limited thereto, and in some embodiments, the light-emitting elements 300 may be disposed between the electrodes 210 and 220.

Figure 14:
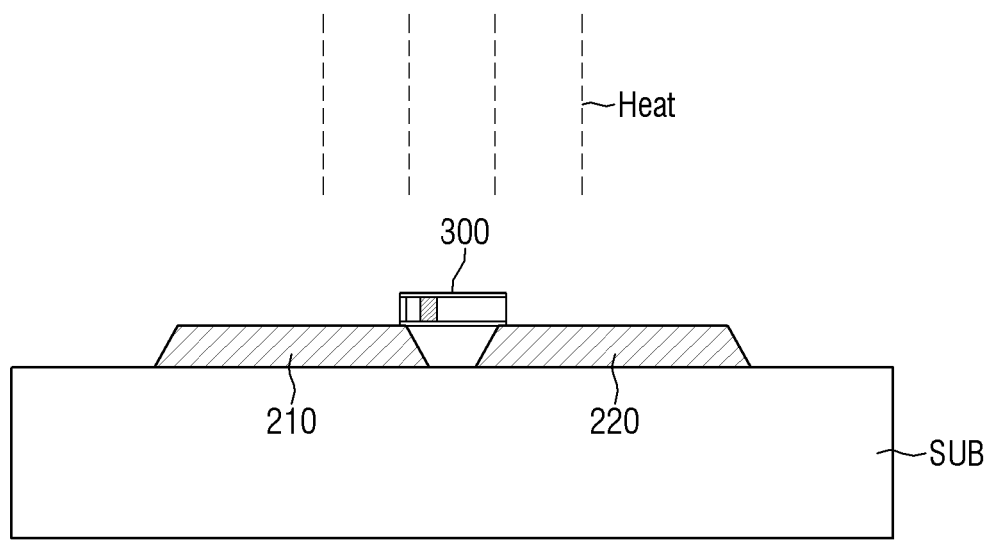
FIG. 14 is a schematic cross-sectional view illustrating one operation of the manufacturing process of the display device according to an embodiment.

FIG. 14 is a schematic cross-sectional view illustrating an operation of the manufacturing process of the display device according to an embodiment.

Referring to FIG. 14, the ink S sprayed onto the target substrate SUB is removed. The removing of the ink S may be performed by a heat treatment device, and the heat treatment device may emit heat or infrared light onto the target substrate SUB. As the ink S sprayed onto the target substrate SUB is removed, the light-emitting elements 300 may be prevented from moving and may be placed between the electrodes 210 and 220.

The display device 10 according to an embodiment may be manufactured by the above-described processes. The manufacturing process of the display device 10 includes applying a magnetic field to the light-emitting elements 300 each including the element dispersion agent 385. In case that the magnetic field is applied to the light-emitting element 300, a magnetic force may be applied to the magnetic metal of the element dispersion agent 385, and the magnetic force may be transmitted to the light-emitting element 300. The light-emitting elements 300 may maintain a dispersed state in the ink S in which the magnetic field is formed, and the ink S to be sprayed in the inkjet printing process may include a uniform number of light-emitting elements 300. Accordingly, in the display device 10, each sub-pixel PXn may include a uniform number of light-emitting elements 300.

Hereinafter, various embodiments of the light-emitting element 300 and the display device 10 according to an embodiment will be described.

The structure of the light-emitting element 300 is not limited to that shown in FIG. 4 and may have another structure.

Figure 15:
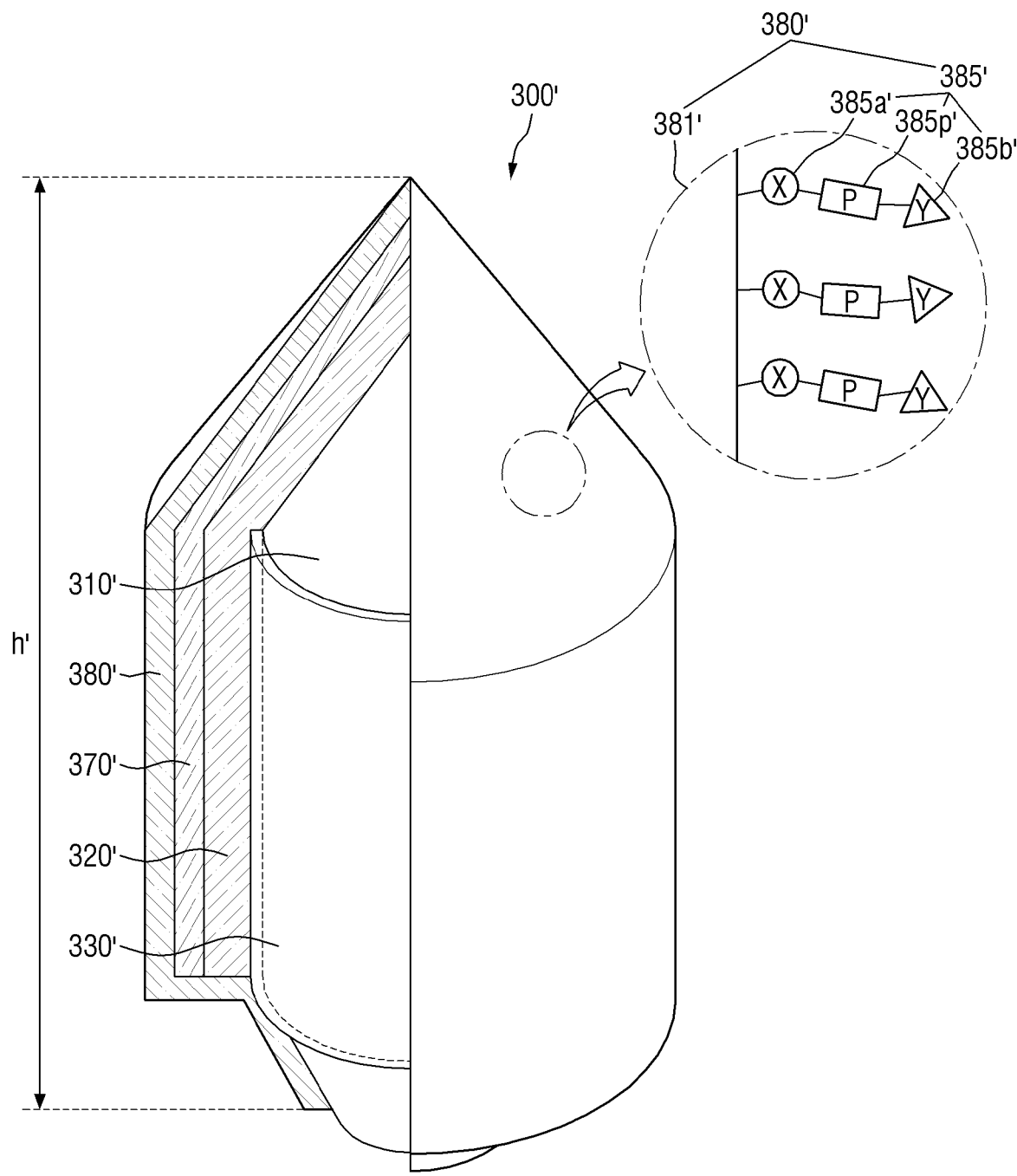
FIG. 15 is a schematic view of a light-emitting element according to another embodiment.

FIG. 15 is a schematic view of a light-emitting element according to another embodiment.

Referring to FIG. 15 a light-emitting element 300' according to an embodiment may have a shape extending in a direction and having a partially inclined side surface. For example, the light-emitting element 300' according to an embodiment may have a partially conical shape. The light-emitting element 300' of FIG. 15 is identical to the light-emitting element 300 of FIG. 4 except that shapes of the layers are partially different. Hereinafter, the same contents will be omitted, and differences will be described.

The light-emitting element 300' may be formed such that layers are not stacked in a direction and each of the layers surrounds an outer surface of another layer. The light-emitting element 300' of FIG. 15 may be formed such that semiconductor layers surround at least a portion of an outer surface of another layer. The light-emitting element 300' may include a semiconductor core of which at least a partial area partially extends in a direction and an insulating layer 380' formed to surround the semiconductor core. The semiconductor core may include a first semiconductor layer 310', an active layer 330', a second semiconductor layer 320', and an electrode layer 370'.

According to an embodiment, the first semiconductor layer 310' may extend in a direction and end portions thereof may be formed to be inclined toward a center portion thereof. The first semiconductor layer 310' of FIG. 15 may have a shape in which a rod-shaped or cylindrical main body portion and end portions having inclined side surfaces. An upper end portion of the main body portion may have a steeper slope than a lower end portion thereof.

The active layer 330' is disposed to surround an outer surface of the main body portion of the first semiconductor layer 310'. The active layer 330' may have an annular shape extending in a direction. The active layer 330' may not be formed on upper and lower end portions of the first semiconductor layer 310'. The active layer 330' may be formed only on a non-inclined side surface of the first semiconductor layer 310'. However, the disclosure is not limited thereto. Accordingly, light emitted from the active layer 330' may be emitted to not only end portions of the light-emitting element 300' in a length direction but also side surfaces thereof based on the length direction. When compared with the light-emitting element 300 of FIG. 4, the light-emitting element 300' of FIG. 15 may include the active layer 330' having a larger area, thereby emitting a larger amount of light.

The second semiconductor layer 320' is disposed to surround an outer surface of the active layer 330' and the upper end portion of the first semiconductor layer 310'. The second semiconductor layer 320' may include an annular main body portion extending in a direction and an upper end portion having a side surface formed to be inclined. For example, the second semiconductor layer 320' may directly contact a parallel side surface of the active layer 330' and the inclined upper end portion of the first semiconductor layer 310'. However, the second semiconductor layer 320' is not formed in the lower end portion of the first semiconductor layer 310'.

The electrode layer 370' is disposed to surround an outer surface of the second semiconductor layer 320'. For example, the electrode layer 370' and the second semiconductor layer 320' may be substantially a same shape. For example, the electrode layer 370' may contact the entire outer surface of the second semiconductor layer 320'.

The insulating layer 380' may be disposed to surround outer surfaces of the electrode layer 370' and the first semiconductor layer 310'. The insulating layer 380' may directly contact the electrode layer 370', the lower end portion of the first semiconductor layer 310', and exposed lower end portions of the active layer 330' and the second semiconductor layer 320'.

In the case of the light-emitting element 300' of FIG. 15, the insulating layer 380' may include an insulating film 381' and an element dispersion agent 385' including a first functional group 385a', a ligand 385p', and a second functional group 385b' and may have a length h'. A description thereof is the same as described above.

The display device 10 according to an embodiment may include electrodes 210 and 220 having different shapes from those of FIGS. 2 and 3.

Figure 16:
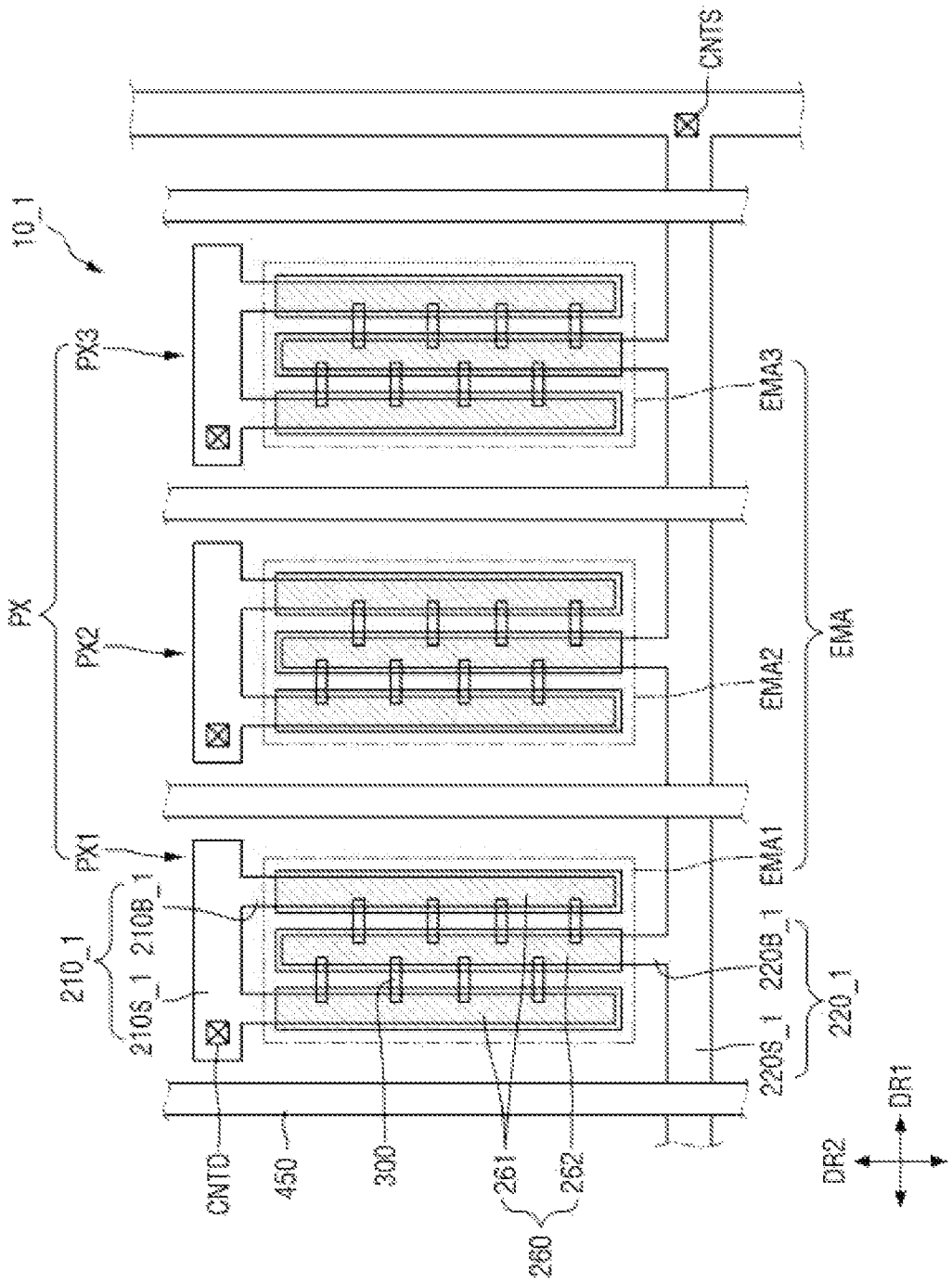
FIG. 16 is a schematic plan view illustrating one pixel of a display device according to another embodiment.

FIG. 16 is a schematic plan view illustrating a pixel of a display device according to another embodiment.

Referring to FIG. 16, in a display device 10_1 according to an embodiment, each of a first electrode 210_1 and a second electrode 220_1 may further include a portion extending in the first direction DR1. The display device 10_1 in FIG. 16 is different from the display device 10 of FIG. 2 in that shapes of the first electrode 210_1 and the second electrode 220_1 are different. Hereinafter, repetitive descriptions thereof will be omitted, and differences therefrom will be mainly provided.

In the display device 10_1 of FIG. 16, the first electrode 210_1 and the second electrode 2201 may respectively include electrode stem portions 210S_1 and 220S_1 extending in the first direction DR1 and one or more electrode branch portions 210B_1 and 220B_1 respectively branched in the second direction DR2 from the electrode stem portions 210S_1 and 220S_1.

Specifically, the first electrode 210_1 may include a first electrode stem portion 210S_1 disposed to extend in the first direction DR1 and one or more first electrode branch portions 210B_1 branched from the first electrode stem portion 210S_1 to extend in the second direction DR2.

Ends of the first electrode stem portion 210S_1 of a pixel may be spaced apart from each other and terminated between the sub-pixels PXn and placed substantially colinear with the first electrode stem portion 210S_1 of an adjacent sub-pixel PXn in a same row (e.g., which is adjacent in the first direction DR1). Since ends of each of the first electrode stem portions 210S_1 disposed in each sub-pixel PXn are spaced apart from each other, an electrical signal may be independently transmitted to each of the first electrode branch portions 210B_1.

The first electrode branch portion 210B_1 is branched from at least a portion of the first electrode stem portion 210S_1 and disposed to extend in the second direction DR2. However, the first electrode branch portion 210B_1 may be terminated in a state of being spaced apart from a second electrode stem portion 220S_1 disposed to face the first electrode stem portion 210S_1.

The second electrode 220_1 may include the second electrode stem portion 220S_1 disposed to extend in the first direction DR1 and one or more second electrode branch portions 220B_1 branched from the second electrode stem portion 220S_1 to extend in the second direction DR2. The second electrode stem portion 220S_1 may be disposed to be spaced apart from and face the first electrode stem portion 210S_1, and the second electrode branch portion 220B_1 may be disposed to be spaced apart from and face the one or more first electrode branch portions 210B_1.

Unlike the first electrode stem portion 210S_1, the second electrode stem portion 220S_1 may be disposed to extend in the first direction DR1 to cross each of the sub-pixels PXn. The second electrode stem portion 220S_1 crossing each sub-pixel PXn may be electrically connected to a peripheral portion of a display area DPA, in which each of the pixels PX or sub-pixels PXn is disposed, or electrically connected to a portion extending from a non-display area NDA in a direction.

The second electrode branch portion 220B_1 may be branched from the second electrode stem portion 220S_1 in the second direction DR2, and terminated in a state of being spaced apart from the first electrode stem portion 210S. Since the second electrode branch portion 220B_1 is disposed to be spaced apart from and face the first electrode branch portion 210B_1, an area in which the light-emitting elements 300 are disposed may be formed between the second electrode branch portions 220B_1 and the first electrode branch portions 210B_1.

FIG. 16 illustrates that two first electrode branch portions 210B_1 and a second electrode branch portion 220B_1 are disposed in a sub-pixel PXn, and the first electrode 210_1 is disposed in a shape surrounding an outer surface of the second electrode branch portion 220B_1. However, the disclosure is not limited thereto. In the display device 101, a larger or smaller number of electrode branch portions 210B_1 and 220B_1 may be disposed in each sub-pixel PXn. In this case, the first electrode branch portions 210B_1 and the second electrode branch portion 220B_1 may be alternately disposed to be spaced apart from each other.

The light-emitting elements 300 may be disposed between the first electrode branch portions 210B_1 and the second electrode branch portion 220B_1, and the first contact electrode 261 and the second contact electrode 262 may be disposed on the first electrode branch portions 210B_1 and the second electrode branch portion 220B_1, respectively. The display device 10_1 of FIG. 16 includes a larger number of electrodes 210_1 and 220_1 or electrode branch portions 210B_1 and 220B_1 in a sub-pixel PXn, and thus a larger number of light-emitting elements 300 may be disposed. In addition, descriptions of the other members are the same as those described above with reference to FIGS. 2 and 3, and thus detailed descriptions thereof will be omitted.

Figure 17:
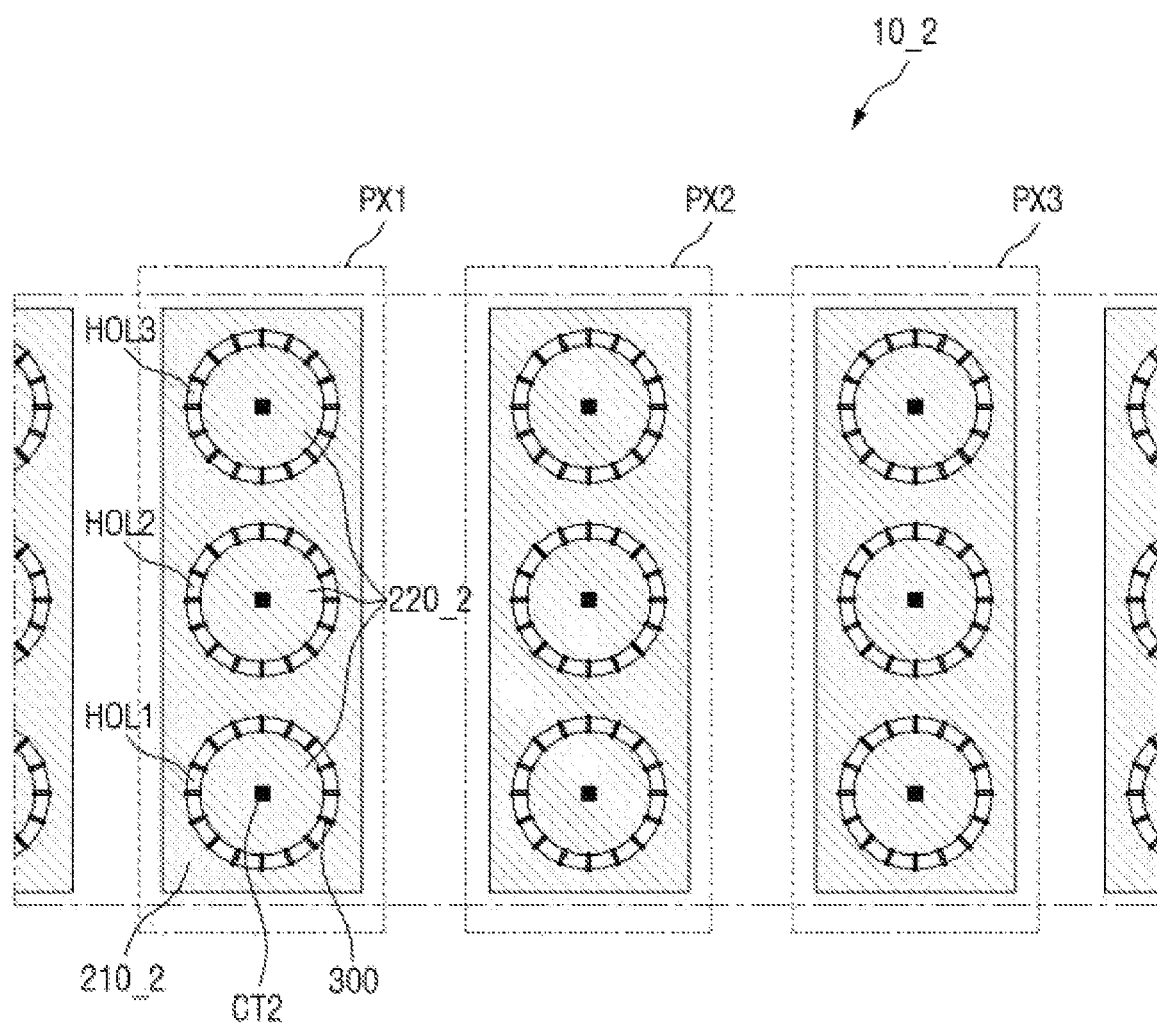
FIG. 17 is a schematic plan view illustrating one pixel of a display device according to still another embodiment.

FIG. 17 is a schematic plan view illustrating a pixel of a display device according to still another embodiment.

Referring to FIG. 17, a display device 102 according to an embodiment may include a first electrode 210_2 and a second electrode 220_2 of which at least a partial area has a curved shape, and the curved area of the first electrode 2102 may be spaced apart from and face the curved area of the second electrode 220_2. The display device 10_2 in FIG. 17 is different from the display device 10 of FIG. 2 in that shapes of the first electrode 210_2 and the second electrode 220_2 are different. Hereinafter, repetitive descriptions will be omitted, and differences therefrom will be mainly provided.

The first electrode 210_2 of the display device 10_2 in FIG. 17 may include holes HOL. As an example, as shown in the drawing, the first electrode 210_2 may include a first hole HOL1, a second hole HOL2, and a third hole HOL3 arranged in the second direction DR2. However, the disclosure is not limited thereto, and the first electrode 210_2 may include a larger or smaller number of holes HOL, or only a hole HOL. Hereinafter, an example in which the first electrode 210_2 includes the first hole HOL1, the second hole HOL2, and the third hole HOL3 will be described.

In an embodiment, the first hole HOL1, the second hole HOL2, and the third hole HOL3 may each have a circular planar shape. Accordingly, the first electrode 210_2 may include a curved area formed by each hole HOL and may face the second electrode 220_2 at the curved area. However, the above description is illustrative, and the disclosure is not limited thereto. A shape of each of the first hole HOL1, the second hole HOL2, and the third hole HOL3 is not limited as long as the shape can provide a space in which the second electrode 2202 is disposed as will be described below. For example, each of the first hole HOL1, the second hole HOL2, and the third hole HOL3 may have a planar shape such as an elliptical shape or a polygonal shape with four or more angles.

Second electrodes 220_2 may be disposed in each sub-pixel PXn. For example, in each sub-pixel PXn, three second electrodes 220_2 may be disposed corresponding to the first to third holes HOL1 to HOL3 of the first electrode 210_2. The second electrode 220_2 may be located in each of the first to third holes HOL1 to HOL3 and may be surrounded by the first electrode 210_2.

In an embodiment, each of the holes HOL of the first electrode 210_2 may have an outer surface with a curved shape, and the second electrode 2202 disposed in correspondence with the hole HOL of the first electrode 2102 may have an outer surface with a curved shape and may be spaced apart from and face the first electrode 210_2. As shown in FIG. 17, the first electrode 210_2 includes holes HOL each having a circular shape in a plan view, and the second electrode 220_2 may have a circular shape in a plan view. In the first electrode 210_2, a curved surface of an area in which the hole HOL is formed may be spaced apart from and face the curved outer surface of the second electrode 220_2. As an example, the first electrode 2102 may be disposed to surround the outer surface of the second electrode 220_2.

As described above, light-emitting elements 300 may be disposed between the first electrode 210_2 and the second electrode 220_2. The display device 10_2 according to the embodiment may include the second electrode 220_2 having a circular shape, and the first electrode 2102 disposed to surround the second electrode 220_2, and the light-emitting elements 300 may be arranged along the curved outer surface of the second electrode 220_2. As described above, since each of the light-emitting elements 300 has a shape extending in a direction, the light-emitting elements 300 arranged along the curved outer surface of the second electrode 220_2 in each sub-pixel PXn may be disposed such that extending directions thereof are directed in different directions. Each of the sub-pixels PXn may have various emission directions according to the direction in which the extending direction of the light-emitting element 300 is directed. In the display device 10_2 according to the embodiment, each of the first electrode 210_2 and the second electrode 220_2 is disposed to have a curved shape, and thus the light-emitting elements 300 disposed therebetween may be disposed to be directed in different directions, so that lateral visibility of the display device 10_2 may be improved.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:
1. A light-emitting element comprising:
a first semiconductor layer doped with a first polarity;
a second semiconductor layer doped with a second polarity different from the first polarity;
an active layer disposed between the first semiconductor layer and the second semiconductor layer; and
an insulating layer surrounding at least an outer surface of the active layer, wherein the insulating layer includes:
an insulating film surrounding the active layer; and
an element dispersion agent bonded to an outer surface of the insulating film,
the element dispersion agent includes:
a magnetic metal;
a ligand forming a coordination bond with the magnetic metal; and
a first functional group bonded to the ligand via an alkylene group represented by $C_nH_{2n}$,
n is an integer of 1 to 6,
the ligand is one of a porphyrin structure and a multidentate structure, and the first functional group is at least one of a silane group, a boronate group, a carboxylic acid group, an amine group, a thiol group, and a phosphoric acid group.

2. The light-emitting element of claim 1, wherein the magnetic metal is one of Fe, Co, Ni, Mn, and Cr.

3. The light-emitting element of claim 1, wherein the first functional group forms a chemical bond with the insulating film.

4. The light-emitting element of claim 3, wherein the element dispersion agent further includes at least one second functional group including a hydrophobic functional group and bonded to the ligand.

5. The light-emitting element of claim 4, wherein the at least one second functional group includes at least one of an alkyl group having 1 to 6 carbon atoms, a fluoroalkyl group having 1 to 6 carbon atoms, and a cycloalkyl group having 3 to 6 carbon atoms.

6. The light-emitting element of claim 1, wherein the element dispersion agent has a structure represented by one of Chemical Formulas A to D below,

[Chemical Formula A]

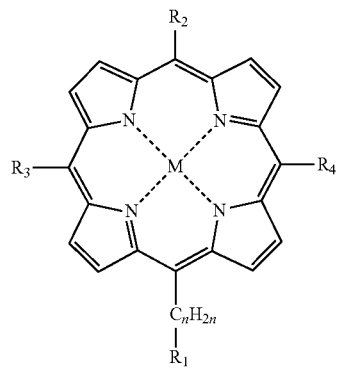

[Chemical Formula B]

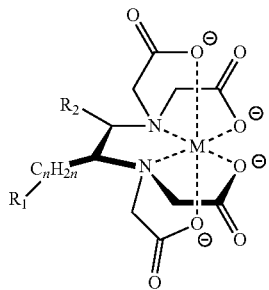

[Chemical Formula C]

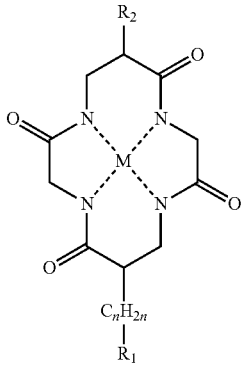

[Chemical Formula D]

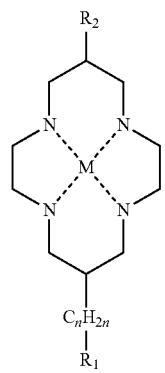

wherein in Chemical Formulas A to D,

M is at least one of $Fe^{2+}$, $Mn^{2+}$, $Co^{2+}$, $Ni^{2+}$, and $Cr^{2+}$, $R_1$ is at least one of a silane group, a boronate group, a carboxylic acid group, an amine group, a thiol group, and a phosphoric acid group, each of $R_2$ to $R_4$ is independently one of hydrogen, an alkyl group having 1 to 6 carbon atoms, a fluoroalkyl group having 1 to 6 carbon atoms, and a cycloalkyl group having 3 to 6 carbon atoms, n is an integer of 1 to 6, and a dash line indicates a coordination bond.

* * * * *